US010790005B1

United States Patent
He et al.

(10) Patent No.: US 10,790,005 B1
(45) Date of Patent: Sep. 29, 2020

(54) TECHNIQUES FOR REDUCING ROW HAMMER REFRESH

(71) Applicant: Micron Technology, Inc., Boise, ID (US)

(72) Inventors: Yuan He, Boise, ID (US); Yutaka Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/396,132

(22) Filed: Apr. 26, 2019

(51) Int. Cl.
    *G11C 11/406* (2006.01)
    *G11C 11/408* (2006.01)

(52) U.S. Cl.
    CPC .... *G11C 11/40618* (2013.01); *G11C 11/4085* (2013.01); *G11C 11/40603* (2013.01); *G11C 11/40615* (2013.01); *G11C 2211/4068* (2013.01)

(58) Field of Classification Search
    CPC ........ G11C 11/40618; G11C 11/40603; G11C 11/40615; G11C 11/4085
    See application file for complete search history.

(56) References Cited

U.S. PATENT DOCUMENTS

| 2017/0186481 A1* | 6/2017 | Oh | G11C 11/406 |
| 2018/0218767 A1* | 8/2018 | Wolff | G11C 11/40611 |
| 2019/0066760 A1* | 2/2019 | Lee | G11C 11/4091 |

* cited by examiner

Primary Examiner — Tri M Hoang
(74) Attorney, Agent, or Firm — Holland & Hart LLP

(57) ABSTRACT

Methods, systems, and devices for techniques for reducing row hammer refresh are described. A memory device may be segmented into regions based on bits (e.g., the least significant bits) of row addresses such that consecutive word lines belong to different regions. A memory device may initiate a refresh operation for a first row of memory cells corresponding to a first word line. The memory device may determine that the first row is an aggressor row of a row hammer attack and may determine an adjacent row associated with a second word line as a victim row that may need to be refreshed (e.g., to counteract potential data corruption due to a row hammer attack). The memory die may determine whether to perform a row-hammer refresh operation on the victim row based on whether the victim row belongs to a region that is masked.

12 Claims, 10 Drawing Sheets

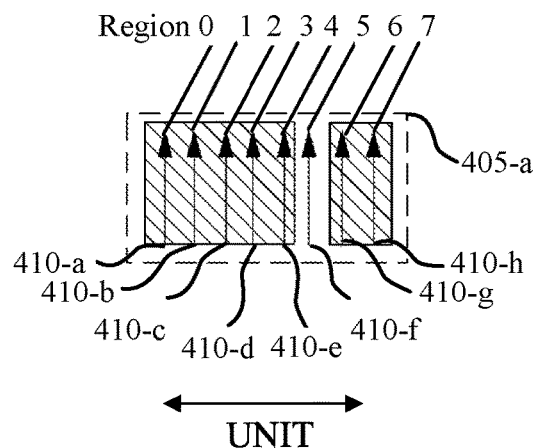
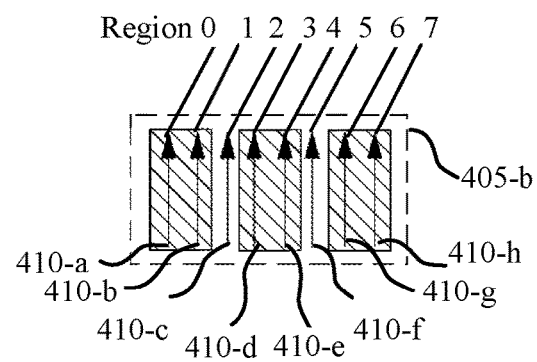
FIG. 4A  FIG. 4B
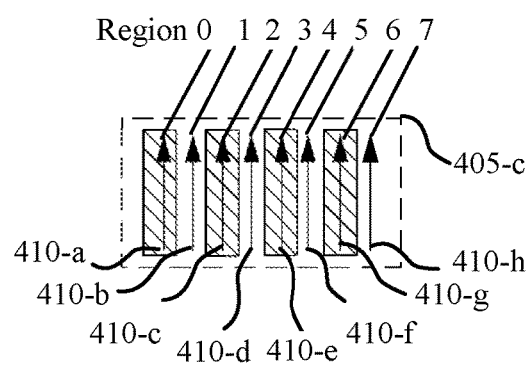
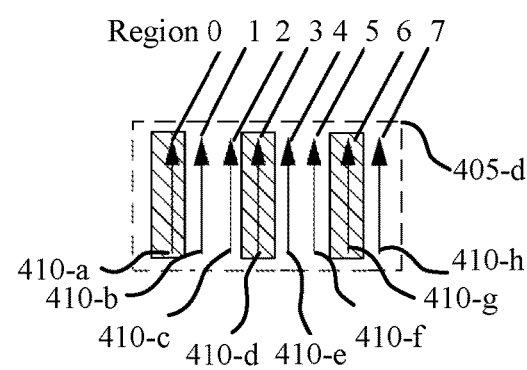
FIG. 4C  FIG. 4D
 Masked Region

TECHNIQUES FOR REDUCING ROW HAMMER REFRESH

BACKGROUND

The following relates generally to a system that includes at least one memory device and more specifically to techniques for reducing row hammer refresh.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, a memory device may perform a refresh operation to read and restore the state of volatile memory cells to mitigate the potential loss of state information. For example, some volatile memory cells, such as DRAM cells, include a capacitor for storing the state of the memory cell, and such memory cells may need to be periodically refreshed.

BRIEF DESCRIPTION OF THE DRAWINGS

FIGS. 4A, 4B, 4C, and 4D illustrate example masking patterns that support techniques for reducing row hammer refresh in accordance with examples as disclosed herein.

DETAILED DESCRIPTION

Row hammering may be an example of an attack on a memory device intended to corrupt data in the memory device, or may be the result of other intended or unintended accesses. A row that is repeatedly activated may be become an aggressor row that interferes with other rows, such as adjacent rows. The memory cells of adjacent rows may be adversely affected by repeatedly activating the aggressor row. In some cases, the adjacent word lines may be referred to as victim word lines (e.g., victim rows). To reduce the quantity of row hammer refreshes, a memory device may be segmented into a plurality of regions using some bits, such as the lower bits (e.g., least significant), of the row address rather than other bits, such as using the upper bits (e.g., most significant). Specifying regions in this manner may result in regions that contain non-consecutive (e.g., interleaved) word lines or rows. In some examples of these regions, adjacent word lines may belong to different regions. These regions may be associated with mask indicators, which may indicate whether the region is masked or unmasked. By defining regions based on the least significant bits of the row address such that adjacent word lines belong to regions that can be masked separately, a memory device may be able to reduce the number of row hammer refreshes that are performed because victim word lines (which may be adjacent to unmasked aggressor word lines) may be masked and therefore may not be refreshed.

Before performing a row hammer refresh operation, the memory device may determine whether the row considered for the row hammer refresh operation is part of a region, such as a masked region or an unmasked region. If the row is part of a masked region, the memory device may refrain from performing the row hammer refresh. Defining the regions such that the word lines of different regions are interleaved may allow the memory device to reduce the quantity of row hammer refresh operations performed by determining whether to perform a row hammer refresh operation based on the masking, and thereby conserving power.

Features of the disclosure are initially described in the context of a memory die as described with reference to FIG. 1. Features of the disclosure are described in the context circuitry, diagrams, and systems as described with reference to FIGS. 2-7. These and other features of the disclosure are further illustrated by and described with reference to an apparatus diagram and flowcharts that relate to techniques for reducing row hammer refresh as described with references to FIGS. 8-10.

Figure 1:
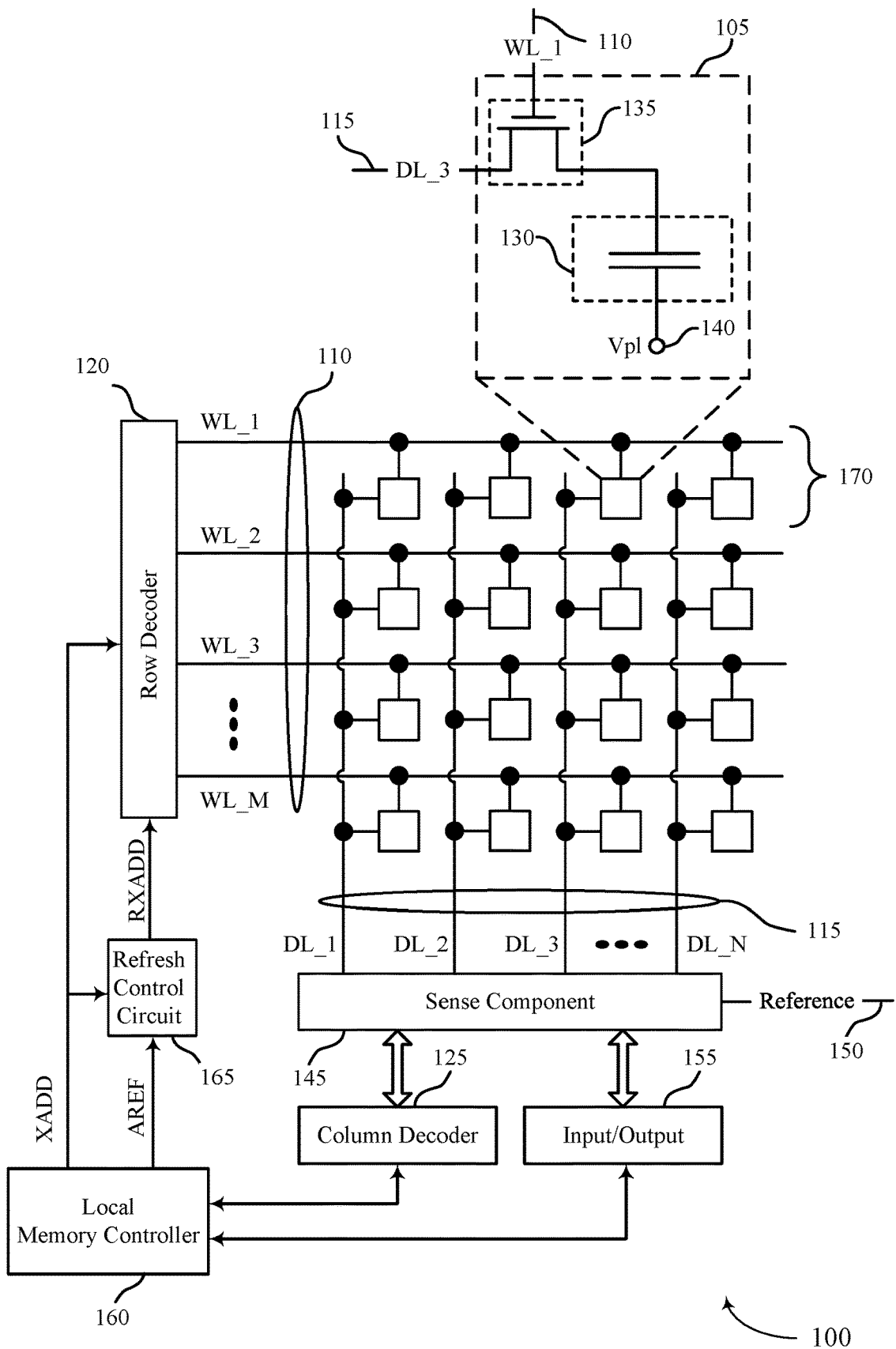
FIG. 1 illustrates an example of a memory die that supports techniques for reducing row hammer refresh in accordance with examples as disclosed herein.

FIG. 1 illustrates an example of a memory die 100 in accordance with examples as disclosed herein. In some cases, the memory die 100 may be referred to as a memory chip, a memory device, or an electronic memory apparatus. The memory die 100 may include one or more memory cells 105 that are programmable to store different logic states. Each memory cell 105 may be programmable to store two or more states. For example, the memory cell 105 may be configured to store one bit of digital logic at a time (e.g., a logic 0 and a logic 1). In some cases, a single memory cell 105 (e.g., a multi-level memory cell) may be configured to store more than one bit of digit logic at a time (e.g., a logic 00, logic 01, logic 10, or a logic 11).

Operations such as reading and writing may be performed on memory cells 105 by activating or selecting access lines such as a word line 110 and/or a digit line 115. In some cases, digit lines 115 may also be referred to as bit lines. References to access lines, word lines and digit lines, or their analogues, are interchangeable without loss of understanding or operation. Activating or selecting a word line 110 or a digit line 115 may include applying a voltage to the respective line.

The memory die 100 may include the access lines (e.g., the word lines 110 and the digit lines 115) arranged in a grid-like pattern. Memory cells 105 may be positioned at intersections of the word lines 110 and the digit lines 115. By biasing a word line 110 and a digit line 115 (e.g., applying a voltage to the word line 110 or the digit line 115), a single memory cell 105 may be accessed at their intersection.

Accessing the memory cells 105 may be controlled through a row decoder 120 or a column decoder 125. For example, a row decoder 120 may receive a row address XADD from the local memory controller 160 and activate a word line 110 based on the received row address. A column decoder 125 may receive a column address from the local memory controller 160 and may activate a digit line 115 based on the received column address. For example, the memory die 100 may include multiple word lines 110, labeled WL_1 through WL_M, and multiple digit lines 115, labeled DL_1 through DL_N, where M and N depend on the size of the memory array. By activating a word line 110 and a digit line 115, e.g., WL_1 and DL_3, the memory cell 105 at their intersection may be accessed. The intersection of a word line 110 and a digit line 115, in either a two-dimensional or three-dimensional configuration, may be referred to as an address of a memory cell 105.

The memory cell 105 may include a logic storage component, such as capacitor 130 and a switching component 135. The capacitor 130 may be an example of a dielectric capacitor or a ferroelectric capacitor. A first node of the capacitor 130 may be coupled with the switching component 135 and a second node of the capacitor 130 may be coupled with a voltage source 140. In some cases, the voltage source 140 may be the cell plate reference voltage, such as Vpl, or may be ground, such as Vss. In some cases, the voltage source 140 may be an example of a plate line coupled with a plate line driver. The switching component 135 may be an example of a transistor or any other type of switch device that selectively establishes or de-establishes electronic communication between two components.

Selecting or deselecting the memory cell 105 may be accomplished by activating or deactivating the switching component 135. The capacitor 130 may be in electronic communication with the digit line 115 using the switching component 135. For example, the capacitor 130 may be isolated from digit line 115 when the switching component 135 is deactivated, and the capacitor 130 may be coupled with digit line 115 when the switching component 135 is activated. In some cases, the switching component 135 is a transistor and its operation may be controlled by applying a voltage to the transistor gate, where the voltage differential between the transistor gate and transistor source may be greater or less than a threshold voltage of the transistor. In some cases, the switching component 135 may be a p-type transistor or an n-type transistor. The word line 110 may be in electronic communication with the gate of the switching component 135 and may activate/deactivate the switching component 135 based on a voltage being applied to word line 110.

A word line 110 may be a conductive line in electronic communication with a memory cell 105 that is used to perform access operations on the memory cell 105. In some architectures, the word line 110 may be in electronic communication with a gate of a switching component 135 of a memory cell 105 and may be configured to control the switching component 135 of the memory cell. In some architectures, the word line 110 may be in electronic communication with a node of the capacitor of the memory cell 105 and the memory cell 105 may not include a switching component.

A digit line 115 may be a conductive line that connects the memory cell 105 with a sense component 145. In some architectures, the memory cell 105 may be selectively coupled with the digit line 115 during portions of an access operation. For example, the word line 110 and the switching component 135 of the memory cell 105 may be configured to couple and/or isolate the capacitor 130 of the memory cell 105 and the digit line 115. In some architectures, the memory cell 105 may be in electronic communication (e.g., constant) with the digit line 115.

The sense component 145 may be configured to detect a state (e.g., a charge) stored on the capacitor 130 of the memory cell 105 and determine a logic state of the memory cell 105 based on the stored state. The sense component 145 may include one or more sense amplifiers to amplify the signal output by the memory cell 105. The sense amplifiers may detect small changes in the charge of a digit line 115 during a read operation and may produce signals corresponding to a logic state 0 or a logic state 1 based on the detected charge. The sense component 145 may be configured to compare the signal received from the memory cell 105 across the digit line 115 to a reference signal 150 (e.g., reference voltage). The sense component 145 may determine the stored state of the memory cell 105 based on the comparison. The detected logic state of the memory cell 105 may be provided as an output of the sense component 145 (e.g., to an input/output 155), and may indicate the detected logic state to another component of a memory device that includes the memory die 100.

The local memory controller 160 may control the operation of memory cells 105 through the various components (e.g., row decoder 120, column decoder 125, and sense component 145). In some cases, one or more of the row decoder 120, column decoder 125, and sense component 145 may be co-located with the local memory controller 160. The local memory controller 160 may be configured to receive commands and/or data from an external memory controller, translate the commands and/or data into information that can be used by the memory die 100, perform one or more operations on the memory die 100, and communicate data from the memory die 100 to the external memory controller in response to performing the one or more operations. The local memory controller 160 may generate row and column address signals to activate the target word line 110 and the target digit line 115 for an access operation, such as a read or write operation. The local memory controller 160 may generate refresh signals to cause various memory cells 105 to be refreshed (e.g., read and re-written). The local memory controller 160 may also generate and control various voltages or currents used during the operation of the memory die 100. In general, the amplitude, shape, or duration of an applied voltage or current discussed herein may be adjusted or varied and may be different for the various operations discussed in operating the memory die 100.

In some cases, the local memory controller 160 may be configured to perform a write operation (e.g., a programming operation) on one or more memory cells 105 of the memory die 100. During a write operation, a memory cell 105 of the memory die 100 may be programmed to store a desired logic state. In some cases, a plurality of memory cells 105 may be programmed during a single write operation. The local memory controller 160 may identify a target memory cell 105 on which to perform the write operation. The local memory controller 160 may identify a target word line 110 and a target digit line 115 in electronic communication with the target memory cell 105 (e.g., the address of the target memory cell 105). The local memory controller 160 may activate the target word line 110 and the target digit line 115 (e.g., applying a voltage to the word line 110 or digit line 115), to access the target memory cell 105. The local memory controller 160 may apply a specific signal (e.g., voltage) to the digit line 115 during the write operation to store a specific state (e.g., charge) in the capacitor 130 of the memory cell 105, the specific state (e.g., charge) may be indicative of a desired logic state.

In some cases, the local memory controller 160 may be configured to perform a read operation (e.g., a sense operation) on one or more memory cells 105 of the memory die 100. During a read operation, the logic state stored in a memory cell 105 of the memory die 100 may be determined. In some cases, a plurality of memory cells 105 may be sensed during a single read operation. The local memory controller 160 may identify a target memory cell 105 on which to perform the read operation. The local memory controller 160 may identify a target word line 110 and a target digit line 115 in electronic communication with the target memory cell 105 (e.g., the address of the target memory cell 105). The local memory controller 160 may activate the target word line 110 and the target digit line 115 (e.g., applying a voltage to the word line 110 or digit line 115), to access the target memory cell 105. The target memory cell 105 may transfer a signal to the sense component 145 in response to biasing the access lines. The sense component 145 may amplify the signal. The local memory controller 160 may fire the sense component 145 (e.g., latch the sense component) and thereby compare the signal received from the memory cell 105 to the reference signal 150. Based on that comparison, the sense component 145 may determine a logic state that is stored on the memory cell 105. The local memory controller 160 may communicate the logic state stored on the memory cell 105 to an external memory controller the device memory controller as part of the read operation.

In some memory architectures, accessing the memory cell 105 may degrade or destroy the logic state stored in a memory cell 105. For example, activation of a word line in DRAM architectures may partially or completely discharge the capacitor of the target memory cell. The sense component 145 may restore the voltage on the digit line 115 according to the sensed logic state, which may restore the voltage on the memory cell 105 to a same or similar voltage as used in the write operation.

In some memory architectures based on volatile memory cells, such as DRAM, the state of a memory cell 105 may need to be periodically refreshed to maintain the state of the memory cell 105 when the memory cell 105 is not accessed for a period of time (and therefore is not restored as part of a read or write operation). The memory die 100 may include logic circuitry (e.g., refresh control circuit 165) that may be configured to periodically perform a refresh operation on memory cells 105 of one or more rows 170 by causing memory cells to be read and restored to the states of the memory cells 105. In some cases, such logic circuitry may be part of local memory controller 160 or may be separate circuitry. In some cases, memory die 100 may perform a refresh operation on memory cells 105 of one or more rows 170 in response to receiving a refresh command from an external host device or based on internal timing that specifies a frequency with which memory cells 105 may be refreshed.

In some cases, each word line 110 may be coupled with multiple memory cells 105. The word line 110 and memory cells 105 may be collectively referred to as a row 170. A word line alone or a word line along with coupled memory cells may be referred to as a row. The terms "word line" and "row" may be used interchangeably.

A refresh operation may be performed in response to receiving a refresh command from an external host device, for example, or in response to an internally generated refresh signal or command indicating that a particular amount of time (which may be based on the maximum refresh interval) has elapsed since the last refresh operation. In some cases, a refresh command may indicate an address of a row or word line to be refreshed.

In some cases, memory cells 105 may be refreshed on a row-by-row basis (e.g., a word line-by-word line basis). During a refresh operation, the information in one or more rows 170 may be read out and then written back. A refresh signal (such as auto-refresh signal, AREF) may control a timing of the refresh operations. In some cases, the memory device may generate one or more "pumps," which may be activations of an internal refresh signal responsive to receiving an activation of the refresh signal. The memory device may perform a refresh operation responsive to the pumps (and/or the refresh signal). The memory device may perform a at each pump and may refresh one or more rows 170.

In some cases, a refresh operation may be performed on a region-by-region basis, and may refresh those regions that store data (e.g., unmasked regions). In such cases, a memory device may maintain a mask indicator for each region that indicates whether the region stores data (e.g., is unmasked) or does not store data (e.g., is masked). The mask indicator may be a bit that is set based on whether the corresponding region is masked or unmasked.

A refresh operation may be an auto-refresh operation. In an auto-refresh operation, the memory die 100 may refresh a group of word lines 110 from a sequence of word lines 110, and then during a next auto-refresh operation may refresh the next group of word lines 110 in the sequence. Over time, the memory die 100 may carry out auto-refresh operations to cycle through the different rows 170 of the memory in order to prevent data loss. In some examples, the memory die 100 may refresh each row 170 of the memory device, and may cycle through the rows 170 with a timing based on a normal rate of data degradation in the memory cells (e.g., so that each row is refreshed more frequently than an expected time it would take for data loss in that row). The memory die 100 may maintain an internal counter to keep track of which row to refresh by incrementing the row address. The counter value may be used to identify a row address.

A refresh operation may be a row hammer refresh operation, sometimes referred to as RHR. A target word line may be activated to perform an access operation on one or more memory cells in the row. Activating a target word line in a memory device may also partially activate one or more adjacent non-target word lines. In some cases, repeated activation of a target word line, which may be referred to as "row hammering," may induce errors in adjacent rows of memory cells due to, for example, electromagnetic coupling. For example, adjacent word lines may receive interference from aggressor word lines. Information in the victim rows may decay such that data may be lost if the victim rows are not refreshed before the next auto-refresh operation of that row. In order to prevent information from being lost, it may be advantageous to identify aggressor rows and then perform a row hammer refresh operation.

As fabrication processes have shrunk semiconductor feature sizes, the number of word line activations that may induce bit errors in adjacent rows has been reduced, leading to a need for more frequent row hammer refresh operations. In some cases, during each refresh cycle, a memory die 100 may perform both a normal refresh operation (e.g., a refresh that is performed on rows of memory cells based on the refresh interval) and a row hammer refresh operation (e.g., a refresh that is performed on rows adjacent to the refreshed rows or performed on rows of memory cells based on detection of a row hammer event). For example, a memory device may perform a regular refresh operation on a target word line and, the memory device may also perform a row hammer refresh operation on one or more adjacent word lines. In some cases, both of these types of refresh operations may be performed in response to a single refresh command or signal.

The memory die 100 may receive commands that may cause it to carry out refresh operations, such as auto-refresh operations and/or row hammer refresh operations. In some cases, the refresh command may be externally issued to the memory die 100. In some cases, the refresh command may be periodically generated by a component of memory die 100. In some cases, when an external signal indicates a refresh entry command, an internal refresh signal AREF may also be activated. The refresh signal AREF may be activated after a command input (e.g., after a command has been received), and may be cyclically activated at an internal timing. Refresh operations may continue automatically. A self-refresh exit command may cause the automatic activation of the refresh signal AREF to stop and return to an IDLE state.

A memory device may be segmented (e.g., partitioned) into logical regions that may be configured to indicate whether the associated memory cells are masked (e.g., do not include information) or are unmasked (e.g., includes information). For example, a bank of memory cells 105 may be partitioned into multiple regions, each of which may include multiple word lines. In some cases, a region may be specified using the upper (e.g., most significant) bits of the row address. For example, a memory device may partition a bank into eight (8) regions by specifying the regions using the upper three bits of a row address. In this case, each region contains multiple consecutive word lines having row addresses with the same upper three bits.

Some memory devices may be configured to transfer data stored in one or more rows of volatile memory cells to non-volatile memory, such as Flash memory. For example, a memory device may identify data that is rarely accessed and save the data in non-volatile memory to free the volatile memory cells for more frequently accessed data. In such cases, the volatile memory cells in which the data was stored may not need to be refreshed, because their data has been transferred to non-volatile memory. Masking indicators may be used to determine if different regions or segments are actively storing data. Some memory devices may determine whether a row of memory cells is currently storing data (e.g., that a row of memory cells is unmasked) before performing a refresh operation on the row, in order to reduce the number of refresh operations and thereby reduce power consumption.

In some cases, the memory die 100 may refresh a row if the corresponding mask indicator indicates that the row is unmasked. This approach may reduce the number of refresh operations that may be performed on the array, thereby reducing power consumption. For example, if a refresh operation is performed on a first row that is unmasked, but an adjacent row is masked, the memory die 100 may not perform a row hammer refresh operation on the adjacent row that is masked.

The memory die 100 may include a refresh component such as a refresh control circuit 165, which may be configured to manage procedures related to refresh operations, including row hammer refresh operations. In some cases, refresh control circuit 165 may be included in local memory controller 160 or may be separate circuitry. A refresh signal AREF may be supplied to the refresh control circuit 165 (e.g., by local memory controller 160) The refresh control circuit 165 may supply a refresh row address RXADD to a row decoder 120, which may refresh a word line 110 indicated by the refresh row address RXADD. The refresh control circuit 165 may control a timing of the refresh operation, and may generate and provide the refresh address RXADD. The refresh control circuit 165 may be controlled to change details of the refreshing address RXADD (e.g., how the refresh address is calculated, the timing of the refresh addresses), or may operate based on internal logic.

The refresh control circuit 165 may selectively output a row hammer refresh address (e.g., a victim address) or automatic refresh addresses (auto-refresh address) as the refreshing address RXADD. The automatic refresh addresses may be a group of addresses from a sequence of addresses of the array of memory cells 105. The refresh control circuit 165 may cycle through the sequence of auto-refresh addresses at a rate determined by AREF.

The refresh control circuit 165 may also determine row hammer refresh addresses which are addresses that may require refreshing (e.g., victim addresses corresponding to victim rows) based on the access pattern of nearby addresses (e.g., aggressor addresses corresponding to aggressor rows) in the memory array. The refresh control circuit 165 may selectively use one or more signals to calculate the row hammer refresh address RXADD. For example, the refresh address RXADD may be a calculated based on the row addresses XADD provided by the address decoder. The refresh control circuit 165 may sample the current value of the row address XADD provided by the local memory controller 160 and determine a row hammer refresh address based on one or more of the sampled addresses.

The row hammer refresh address may be based on characteristics over time of the row addresses received using the XADD signal. The XADD signal may be generated by the local memory controller 160, by an address decoder, by the row decoder 120, by the column decoder 125, or a combination thereof. In some cases, the local memory controller 160 may include the address decoder. The refresh control circuit 165 may sample the current row address XADD to determine its characteristics over time. The sampling may occur intermittently, with each sample acquired based on a random or semi-random timing.

The refresh control circuit 165 may use different methods to calculate a row hammer refresh address based on the sampled row address XADD. For example, the refresh control circuit 165 may determine if a given row is associated with an aggressor row address, and then calculate and provide row addresses corresponding to victim row addresses of the aggressor row address as the row hammer refresh address. In some cases, more than one victim address may correspond to a given aggressor address. In this case the refresh control circuit may queue up multiple row hammer refresh addresses, and provide them sequentially when it determines that a row hammer refresh address should be provided. The refresh control circuit 165 may provide the row hammer refresh address right away, or may queue up the row hammer refresh address to be provided at a later time (e.g., in the next time slot available for a row hammer refresh). The refresh address RXADD may be provided with a timing based on a timing of the refresh signal AREF.

In some cases, the refresh control circuit 165 may include or may be coupled with an address component that is configured to identify the row address XADD and generate a refresh address RXADD based on the row address XADD. The address component may identify the row address XADD based on receiving a refresh trigger, such as an AREF signal. The address component may be part of the local memory controller 160.

The refresh control circuit 165 may provide one or more refresh pump signals responsive to each activation of the refresh signal AREF. Each activation of the refresh signal AREF may trigger a refresh cycle (e.g., an interval of time over which the memory die performs one or more refresh operations) that includes multiple refresh pumps, for example. That is, each activation of the refresh signal may serve as a refresh trigger that triggers a refresh cycle.

In some cases, the refresh control circuit 165 may provide a set quantity of refresh pumps (e.g., activations of the refresh pump signal) for each activation of AREF. For example, the refresh control circuit 165 may provide two pumps for each activation of AREF, although more or less pumps may be used in other examples. Each pump may be associated with a refresh operation (e.g., either an auto-refresh operation or a row hammer refresh operation) and the row decoder 120 may activate rows for a refresh operation based on the refresh address RXADD each time the refresh pump signal is activated. In some cases, there may be a row hammer refresh operation in each group of refresh pumps (e.g., there may be at least one row hammer refresh operation responsive to each activation of AREF). In some cases, the number of row hammer refresh operations may change between different groups of refresh pumps. For example, there may be different numbers of row hammer refresh operations responsive to even and odd activations of AREF.

The refresh control circuit 165 may identify a first word line for a first refresh operation (e.g., an auto-refresh operation) and output a first refresh address RXADD associated with the first word line. Row decoder 120 may activate a row 170 for refreshing based on the first refresh address. In some cases, refresh control circuit 165 may identify a second word line (e.g., an adjacent word line of a victim row) for a second refresh operation (e.g., a row hammer refresh operation), and output a second refresh address RXADD associated with the second word line. In some cases, refresh control circuit 165 may include mask checking circuitry to identify a masking region associated with the second word line and determine, based on identifying the masking region, a mask indicator associated with the masking region. In some cases, the mask indicator indicates whether data is stored in the masking region (e.g., in a victim row). The mask indicator may be stored in a storage component, such as a register. For example, the mask indicator may be stored within a mask field that contains multiple mask indicators corresponding to the multiple regions.

The refresh control circuit 165 may cause a row hammer refresh operation to be performed on memory cells coupled with the second word line based on the mask indicator. For example, refresh control circuit 165 may cause a row hammer refresh operation to be performed on the victim row if the mask indicator indicates that there is data stored in the victim row, and may not perform a row hammer refresh operation on the victim row if the mask indicator indicates that there is not data stored in the victim row. In some cases, a memory die 100 may similarly use the mask checking circuitry to determine whether to perform an auto-refresh operation on a word line by identifying a masking region to which the word line belongs and determining, based on an associated mask indicator, whether the masking region is masked.

Figure 2:
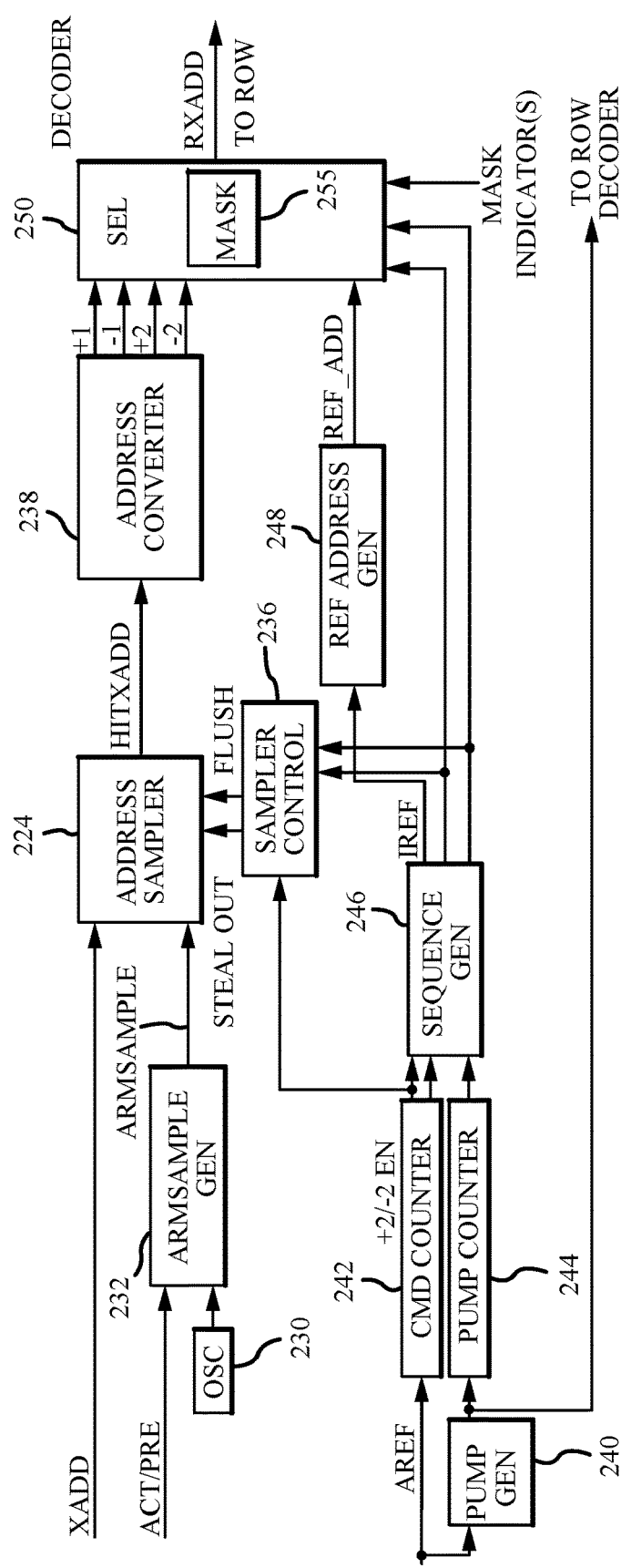
FIG. 2 illustrates an example of a row decoder circuit that supports techniques for reducing row hammer refresh in accordance with examples as disclosed herein.

FIG. 2 illustrates an example of a refresh control circuit 200 that supports techniques for reducing row hammer refresh in accordance with examples as disclosed herein. Refresh control circuit 200 may be an example of refresh control circuit 165 described with reference to FIG. 1. In some cases, refresh control circuit 200 may be used to refresh memory cells, such as DRAM memory cells. In some cases, refresh control circuit 200 may be included on a memory die, such as memory die 100, and may be part of a local memory controller, such as local memory controller 160, or may be separate circuitry.

The refresh control circuit 200 may provide a refresh address RXADD to a row decoder (e.g., row decoder 120 of FIG. 1). The refresh control circuit 200 may use internal logic to determine if the provided refresh address RXADD indicates a victim row associated with an aggressor row as part of a row hammer refresh address or if the refresh address RXADD indicates a group of auto-refresh addresses as part of an auto-refresh operation. The refresh control circuit 200 may also identify aggressor rows and may control the timing of refresh operations based on the timing of the refresh signal AREF.

In some cases, refresh control circuit 200 may be capable of performing row hammer refresh operations on different word lines (e.g., rows) relative to a reference word line (e.g., row). In some row hammer refresh operations, a pair of victim rows are identified which are physically adjacent to the aggressor row (e.g., having row addresses that are numerically consecutive with the aggressor row). These victim rows may generally be referred to as +1 and −1 victim rows. In some row hammer refresh operations, the refresh control circuit 200 may identify a pair of victim rows which are adjacent to the adjacent rows, which may generally be referred to as +2 and −2 victim rows (e.g., having row addresses that are numerically two away from the aggressor row). Accordingly, the +1 row is between the aggressor row and the +2 row, and the −1 row is between the aggressor row and the −2 row.

The refresh control circuit 200 may also provide multiple "pumps" responsive to each activation of the refresh signal AREF. The pumps may control the timing of refresh operations, and a refresh address RXADD may be provided and refreshed with each pump. Other refresh control circuits in other examples may, for example, perform row hammer refresh operations on different word lines or different combinations of the words lines than described herein, and/or may include row hammer refresh operations where the victim rows may have a different relationship to (e.g., position relative to) the aggressor row.

The refresh control circuit 200 may include an address sampler 22 that may determine if a row address XADD is an aggressor address. The address sampler 22 may 'sample' the value of XADD responsive to a sampling signal provided by a sampling signal generator 232.

The sampling signal generator 232 may provide a sampling signal ArmSample with timing which may be based in part on an oscillator 230 and the ACT/PRE signal of the memory. The address sampler 22 may provide an identified aggressor address to an address converter 238, which determines victim rows based on the identified aggressor address and provides them to selector 250. The refresh control circuit 200 also includes a pump generator 240, which generates a number of pump signals responsive to the refresh signal REF and provides them to the row decoder and to a pump counter 244 which counts the pumps and provides that count to a sequence generator 246. The refresh signal REF is also provided to a command counter 242, which may provide a +2/−2 En signal to a sampler control circuit 236 and to the sequence generator 246 and a count value to the sequence generator 246. Based on +2/−2 En, the count value and the count of pumps, the sequence generator 246 provides an internal refresh signal (IREF). The internal refresh command IREF may be provided to a refresh address generator 248 which may provide auto-refresh addresses to the selector 250.

Mask checker 255 may determine whether the word line is masked based on refresh address RXADD and on mask indicators. For example, mask checker 255 may identify a region to which a word line belongs based on the lower three bits of the row address RXADD, and may determine whether the segment is masked or unmasked based on a value of a mask indicator that corresponds to the identified segment. In some cases, if the word line is unmasked, refresh control circuit 200 may provide the refresh address RXADD to row decoder 120. Alternatively or additionally, if the word line is masked, the mask checker 255 may prevent refresh control circuit 200 from providing the refresh address RXADD to row decoder 120, thereby causing the memory die 100 to refrain from performing the refresh operation. In some cases, the mask indicators may be stored in a mode register that may be configured to be accessed by mask checker 255. In some cases, indications of the regions may be stored in a mode register that may be configured to be accessed by mask checker 255.

The refresh control circuit 200 may receive the row address XADD and an activation and/or pre-charge signal ACT/PRE (e.g., from a local memory controller). These may be used, in part, to determine if a given row specified by XADD is an aggressor row. The value of XADD may change over time as the memory performs operations (such as access operations) on different word lines of the memory. The address sampler 22 may 'sample' a current value of the row address XADD when the sampling signal ArmSample is activated. Based on the values of one or more sampled address(es), the address sampler 22 may provide an aggressor address HitXADD to the address converter 238.

The sampling signal generator 232 may provide activations of the sampling signal ArmSample to the address sampler 22. In some examples, the sampling signal generator 232 may provide the sampling signal ArmSample with regular timing. In some examples, the sampling signal generator 232 may provide activations of ArmSample with random, semi-random, and/or pseudo-random timing. In some examples, the timing at which ArmSample is provided may be influenced by one or more additional signals. For example, in the particular refresh control circuit 200 of FIG. 2, the sampling signal generator 232 may semi-randomly provide activations of ArmSample based on a timing signal provided by the oscillator 230 and the ACT/PRE signals.

In the example of FIG. 2, the address sampler 22 may be a content addressable memory (CAM) sampler, and may store a number of sampled addresses. The address sampler 22 may provide an address as the aggressor address HitXADD. The address converter 238 may receive the aggressor address HitXADD and provide the addresses of victim rows associated with the provided aggressor address. The address converter 238 may determine the address of victim rows based on a physical relationship between the victim rows and the row associated with the aggressor address. The address converter may provide victim addresses, such as two pairs of victim addresses, +1 and −1 which are adjacent to the aggressor row, and +2 and −2, which are adjacent to +1 and −1 respectively.

The pump generator 240 may receive the refresh signal AREF, and may provide a plurality of activations of a pump signal in response. For example, the pump generator 240 may provide two activations of the pump signal in response to each activation of AREF. More or fewer pumps may be provided in other examples. The activations of the pump signal may be provided to the row decoder 120 and the row decoder 120 may perform a refresh operation on the refresh address RXADD (e.g., each time the pump signal is activated). Accordingly, responsive to each activation of AREF, a number (in this example, two or more, which may include one or more of an auto refresh operation, a +1 victim row refresh, a −1 victim row refresh, a +2 victim row refresh, and/or a −2 victim row refresh) of refresh operations are performed.

The command counter 242 may count a number of activations of the refresh signal, while the pump counter 244 counts a number of activations of the refresh pump signal. The command counter 242 provides the signal +2/−2 En based on the number of activations of the refresh signal AREF. In some examples, +2/−2 En may be provided at an active level responsive to the first four activations of AREF out of a group of 16, or +2/−2 En may be provided as one shot pulse to control the first four activations of AREF out of a group of 16. In some cases, +2/−2 En may be active for four activations of AREF and then inactive for twelve activations of AREF. The cycle may then repeat. Other timings of the activations of +2/−2 En may be used in other examples.

The pump counter 244 may count a number of activations of the refresh pump signal provided by the pump generator 240, and may provide that count to the sequence generator 246. Each time the pump signal is activated by the pump generator 240, the pump counter 244 may adjust (e.g., increment) a value of a pump count. In some examples, the pump counter 244 may provide a signal which indicates a value of the pump count to the sequence generator 246. In some examples, the pump counter 244 may provide a signal which may be active when the pump count is at a certain value or values. For example, the pump counter 244 may have a first value, such as a maximum value, and may reset to a second value, such as a minimum value, and provide a signal when the first value is exceeded.

The sequence generator 246 may determine if a given activation of the pump signal will be associated with an auto-refresh operation or a row hammer refresh operation (e.g., a +1/−1 refresh operation or a +2/−2 refresh operation). The sequence generator 246 may receive the pump count from the pump counter 244 and the +2/−2 En signal from the command counter 242. Based on the states of these inputs, the sequence generator 246 may provide one or more signals which indicate the refresh operation that should be performed. The sequence generator 246 may provide the internal refresh signal IREF to indicate that an auto-refresh operation should be performed.

The refresh address generator 248 may provide an auto refresh address (or group of auto-refresh addresses) Ref_Add responsive to an activation of the internal refresh signal IREF. In some examples, Ref_Add may be a signal which represents a block of addresses to be refreshed. The refresh address generator 248 may have a sequence of memory addresses, and may provide a next group of addresses from the sequence each time the internal refresh signal IREF is activated. In some examples, the refresh address generator 248 may include a refresh address counter, and may count through a list of refresh addresses each time the signal IREF is activated.

The selector 250 generates either the auto-refresh address(es) Ref_Add, or one of the row hammer refresh addresses +1, −1, +2, or −2 as the refresh address RXADD. The selector 250 determines, using mask checker 255, whether the refresh address RXADD corresponds to a masked word line by identifying, using the lower bits (e.g., least-significant bits) of RXADD, a masking region associated with RXADD, and determining whether the masking region is masked or unmasked based on mask indicators, as described in more detail with reference to FIGS. 3A and 3B.

The sampler control circuit 236 may indicate that that a new aggressor address HitXADD should be provided by the address sampler 224. The address sampler 224 may store a plurality of potential aggressor addresses. Responsive to the indication from the sampler control circuit 236, the address sampler 224 may provide one of the stored addresses as the aggressor address HitXADD, and the address converter 238 may determine the addresses +1, −1, +2, and −2 based on the provided aggressor address HitXADD.

The sampler control circuit 236 may provide the signal Flush after all victim addresses for a given identified aggressor address HitXADD have been refreshed. In some examples, the sampler control circuit 236 may provide the signal Flush responsive to the states of +2/−2 En, Steal (+2/−2), and Steal (all). In some examples, the signal +2/−2 En being in an active state may indicate that the second type (e.g., +2 and −2) of row hammer refresh operation should be performed instead of the first type (e.g., +1 and −1) of row hammer refresh operation. In some examples, the signal +2/−2 En being active may indicate that both the first type (e.g., +1 and −1) and the second type (e.g., +2 and −2) of row hammer refresh operations should be performed on a given aggressor address. For example, when +2/−2 En is active, the signal Flush may be provided after each of +1, −1, +2, and −2 for a given aggressor address HitXADD have been provided by the selector 250 as the refresh address RXADD.

In some cases, the refresh control circuit 200 or other components of the memory die may include circuitry to detect repeated accesses to a word line, which may indicate a row hammer event. The memory device may then refresh the memory cells in adjacent rows (e.g., in the +/−1 and/or +/−2 victim rows) to mitigate the potential impact of the row hammer. For example, such logic circuitry may detect when a particular word line has been repeatedly accessed some number of times within a relatively short time duration, and may perform a row hammer refresh operation on memory cells coupled with adjacent word lines (such as +/−1 word lines and/or +/−2 word lines) to reduce the likelihood of data corruption.

Figure 3A:
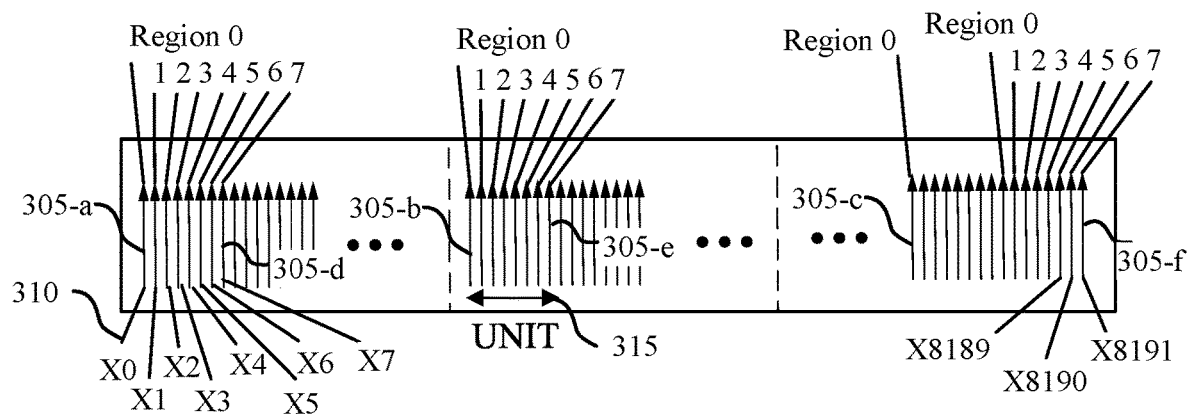
FIGS. 3A and 3B illustrate examples of masking regions that support techniques for reducing row hammer refresh in accordance with examples as disclosed herein.
Figure 3B:
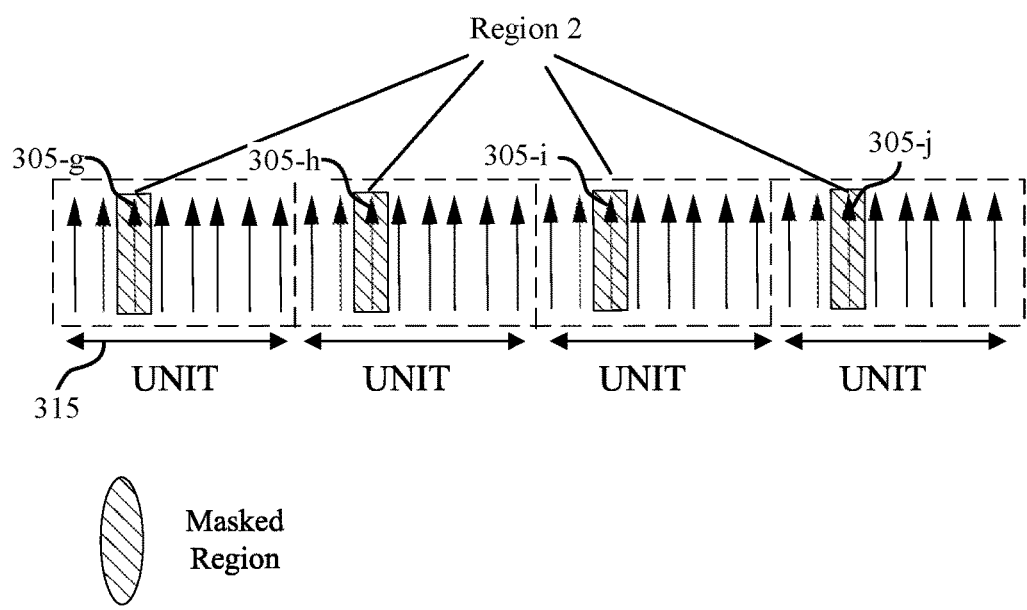

FIGS. 3A and 3B illustrate examples of masking regions that support techniques for reducing row hammer refresh in accordance with examples as disclosed herein.

FIG. 3A depicts multiple word lines 305, each of which may be associated with a row address 310. For example, word line 305-*a* may have a row address 310 of X0, word line 305-*d* may have a row address 310 of X5, word line 305-*f* may have a row address of X8189, etc. Each word line 305 may be included in a region. Not all row addresses and regions are labeled in FIG. 4, for clarity.

In the example of FIG. 3A, eight (8) consecutive word lines 305 (e.g., consecutively adjacent word lines 305 having row addresses that are numerically consecutive) may be considered as a unit 315, with each word line 305 in a unit 315 being included in a different region. In such examples, adjacent word lines 305 may be included in different regions (e.g., as a result of regions being defined based on the lower three bits of the row addresses 310). For example, Region 2 may include the third word line in each unit, which may include word line 305-*g*, 305-*h*, 305-*i*, and 305-*j*.

In this example, there may be eight (8) regions, Regions 0 through 7, that may logically partition some or all of a memory array based on the lower (e.g., least significant) three bits of the row addresses 310. That is, the lower three bits of the row address associated with each word line 305 may be used to determine the region to which the word line 305 (and therefore the row) belongs. In this case, a region is not a contiguous area of memory (e.g., a region is a discontiguous area of memory), since the word lines in the region are not consecutive.

In other examples, there may be more or fewer than 8 regions that may be specified using more or fewer than the lower three bits of the row address. For example, a region may be specified using the lower two (2) bits of the row address, or using the lower four (4) bits of the row address, or using some other number of lower bits of the row address, depending on how many regions may be desired. By using the lower bits of the row address to determine what region is associated with a word line, the different regions may be interleaved with each other throughout the memory array. By contrast, using the first three bits of the row address to determine a region may cause regions to include consecutive blocks of adjacent word lines.

In FIG. 3A, word lines 305-*a*, 305-*b*, 305-*c* may have row addresses 310 having the same lower three bits (e.g., 000), and word lines 305-*d*, 305-*e*, and 305-*f* may have row addresses 310 having the same lower three bits (e.g., 111). The word lines 305-*a*, 305-*b*, and 305-*c* may be included in the same region (e.g., Region 0) and word lines 305-*d*, 305-*e*, and 305-*f* may be included in the same region (e.g., Region 7).

In some cases, each region may be associated with a corresponding mask indicator that indicates whether the region is masked or unmasked. When a region is masked it may indicate that data is not stored in any of the memory cells coupled with the word lines of the region. When a region is unmasked it may indicate that data is stored in one or more memory cells coupled with the word lines of the region. That is, when data is stored in a memory cell associated with a region, the mask indicator will indicate that the region is unmasked. The mask indicator may be specified using a mask field, for example. For example, the mask field may be an eight-bit field that provides eight one-bit mask indicators corresponding to the eight regions. In some cases, the mask field may be stored in a mode register. Such mask indicators may be used to determine whether to perform a refresh operation on rows in the region, thereby reducing the quantity of refresh operations (e.g., refresh operations on rows that do not contain data) thereby conserving power.

A memory device may mask one or more regions by, for example, setting a bit in the corresponding mask indicator. A memory device may determine whether to mask a region based on whether any word line 305 in the region has been recently accessed, indicating that one or more memory cells coupled with the word line may contain data. If none of the word lines 305 in the region have been recently accessed (e.g., within a threshold), then the rows of memory cells associated with word lines 305 in the region may not need to be refreshed, and the region may therefore be masked. If any of the word lines 305 in the region have been recently accessed (such as during a normal access operation or during a row hammer event), then the row of memory cells associated with the accessed word line 305 in the region may need to be refreshed, and the region may therefore be unmasked.

In some cases, a memory device may be configured to determine whether a particular word line 305 is masked by determining whether the region to which the word line belongs is masked. For example, if Region 2 is masked, as indicated in FIG. 3B with cross-hatching, then word lines 305-g, 305-h, 305-i, 305-j may be masked because they belong to Region 2. A memory device may determine whether to perform a row hammer refresh operation on a row based on whether the word line associated with the row is masked or unmasked.

FIGS. 4A, 4B, 4C, and 4D illustrate examples of masking patterns that support techniques for reducing row hammer refresh in accordance with examples as disclosed herein. Example masking patterns 405-a, 405-b, 405-c, and 405-d may occur in memory devices that use the lower bits of row addresses to specify regions rather than using the upper bits of row addresses to specify regions, and may provide examples of cases in which this lower-bit approach, combined with region masking, may enable a reduction in row hammer refreshes.

Masking pattern 405-a illustrates an example where only one region is unmasked (e.g., only one word line 410 in each unit is unmasked), and no row hammer refreshes may be needed even if the unmasked region includes an aggressor word line, because the adjacent word lines are masked. For example, in masking pattern 405-a, only one region (Region 5) is unmasked, and the remaining regions are masked. Word line 410-f is included in unmasked Region 5 and is therefore unmasked. In some cases, word line 410-f may be identified as an aggressor word line (e.g., based on previous repeated accesses to word line 410-f). In this case, no victim rows may need to be refreshed because the victim rows are all masked (e.g., data is not stored in the memory cells coupled with the victim rows). That is, +/−1 adjacent word lines 410-e, 410-g and +/−2 adjacent word lines 410-d, 410-h all belong to masked regions are therefore masked.

For example, a refresh control circuit (such as refresh control circuit 165, 200) may determine that a row address XADD corresponds to an aggressor word line (e.g., word line 410-f). The refresh control circuit may then identify a victim word line (e.g., +1 victim word line 410-g, −1 victim word line 410-e, +2 victim word line 410-h, or −2 victim word line 410-d) based on the row address of the aggressor word line. The row control circuit may identify a region associated with the victim word line (e.g., based on the lower three bits of the row address of the victim word line) and determine whether the region is masked (e.g., by determining whether the mask indicator corresponding to the region is set to a value that indicates the region is masked). If the region of the victim word line is masked, as is the case in masking pattern 405-a, the refresh control circuit may not provide the victim row address RXADD to the row decoder, thereby refraining from performing (e.g., suppressing) the row hammer refresh operation. Similar operations may be used for other masking patterns.

Masking pattern 405-b illustrates an example where pairs of adjacent regions are masked, (e.g., pairs of adjacent word lines in each unit are masked), and no row hammer refreshes may be needed even if an unmasked region includes an aggressor word line, because the adjacent word lines are masked. For example, in masking pattern 405-b, pairs of adjacent regions (Regions 0 and 1, Regions 3 and 4, Regions 6 and 7) are masked, and the remaining regions (Regions 2 and 5) are unmasked. Word lines 410-c and 410-f are included in unmasked Regions 2 and 5 (respectively), and are therefore unmasked. In some cases, word line 410-c and/or word line 410-f may be identified as an aggressor word line (e.g., based on previous repeated accesses to word line 410-c and/or word line 410-f). In this case, no victim rows may need to be refreshed because the victim rows are all masked. That is, +/−1 adjacent word lines 410-b, 410-d, 410-e, 410-g and +/−2 adjacent word lines 410-a, 410-e, 410-g all belong to masked regions are therefore masked.

Masking pattern 405-c illustrates an example where only odd regions or only even regions are unmasked, (e.g., every other word line in a unit is unmasked), and no row hammer refreshes of +/−1 victim word lines may be needed even if an unmasked region includes an aggressor word line, because the +/−1 victim word lines are masked. In this case, the +/−2 victim word lines may still need to be refreshed because they are not masked. For example, in masking pattern 405-c, even regions (Regions 0, 2, 4, 6) are masked, and odd regions (Regions 1, 3, 5, 7) are unmasked. Word lines 410-b, 410-d, 410-f, and 410-h are included in unmasked Regions 1, 3, 5, 7 (respectively), and are therefore unmasked.

In some cases, word line 410-b, 410-d, 410-f, and/or 410-h may be identified as an aggressor word line (e.g., based on previous repeated accesses to word line 410-b, 410-d, 410-f, and/or 410-h). In this case, the corresponding +/−1 victim rows may not need to be refreshed because these victim rows are all masked. That is, +/−1 adjacent word lines 410-a, 410-c, 410-e, 410-g belong to masked regions are therefore masked. However, the corresponding +/−2 victim rows may still need to be refreshed because these victim rows are all unmasked. That is, +/−2 adjacent word lines 410-b, 410-d, 410-f, 410-h belong to masked regions are therefore masked.

Masking pattern 405-d illustrates an example where some pairs of adjacent regions are unmasked and these pairs are adjacent to masked regions, and no row hammer refreshes of one of the +/−1 victim word lines may be needed even if an unmasked region includes an aggressor word line, because one or more of the +/−1 victim word lines are masked. In this case, the +/−2 victim word lines may still need to be refreshed because they may not be masked.

For example, in masking pattern 405-d, two pairs of regions (Regions 1 and 2 and Regions 4 and 5) are unmasked and are adjacent to masked regions (Regions 0, 3, 6). Word lines 410-b, 410-c, 410-e, 410-f, and 410-h are included in unmasked Regions 1, 3, 5, 7 (respectively), and are therefore unmasked. In some cases, word line 410-b, 410-c, 410-e, 410-f, and/or 410-h may be identified as an aggressor word line (e.g., based on previous repeated accesses to word line 410-b, 410-c, 410-e, 410-f, and/or 410-h). In this case, at least one of the corresponding +/−1 victim rows may not need to be refreshed because some of the +/−1 victim rows are masked. That is, +/−1 adjacent word lines 410-a, 410-d, 410-g belong to masked regions are therefore masked. However, one or both of the corresponding +/−2 victim rows may still need to be refreshed because these victim rows may be unmasked. That is, +/−2 adjacent word lines 410-*c* (a victim row of 410-*e*), 410-*e* (a victim row of 410-*c*), and 410-*h* (a victim row of 410-*f*) belong to masked regions are therefore masked.

A memory device or memory array may exhibit any of these example scenarios of masking patterns. Such masking patterns 400-*a*, 400-*b*, 400-*c*, and 400-*d* are provided by way of examples to illustrate different row hammer refresh operations that may occur based on different maskings. Other masking patterns, not expressly illustrated, are included within the scope of this disclosure. There may be multiple masking patterns that may enable a reduction in row hammer refresh operations. Such masking patterns may arise when regions are defined based on the lower bits of a row address to enable independent masking of adjacent word lines (rows). Such masking patterns may be detected using, for example, the logic diagram discussed with reference to FIG. 6, or using other techniques.

Figure 5:
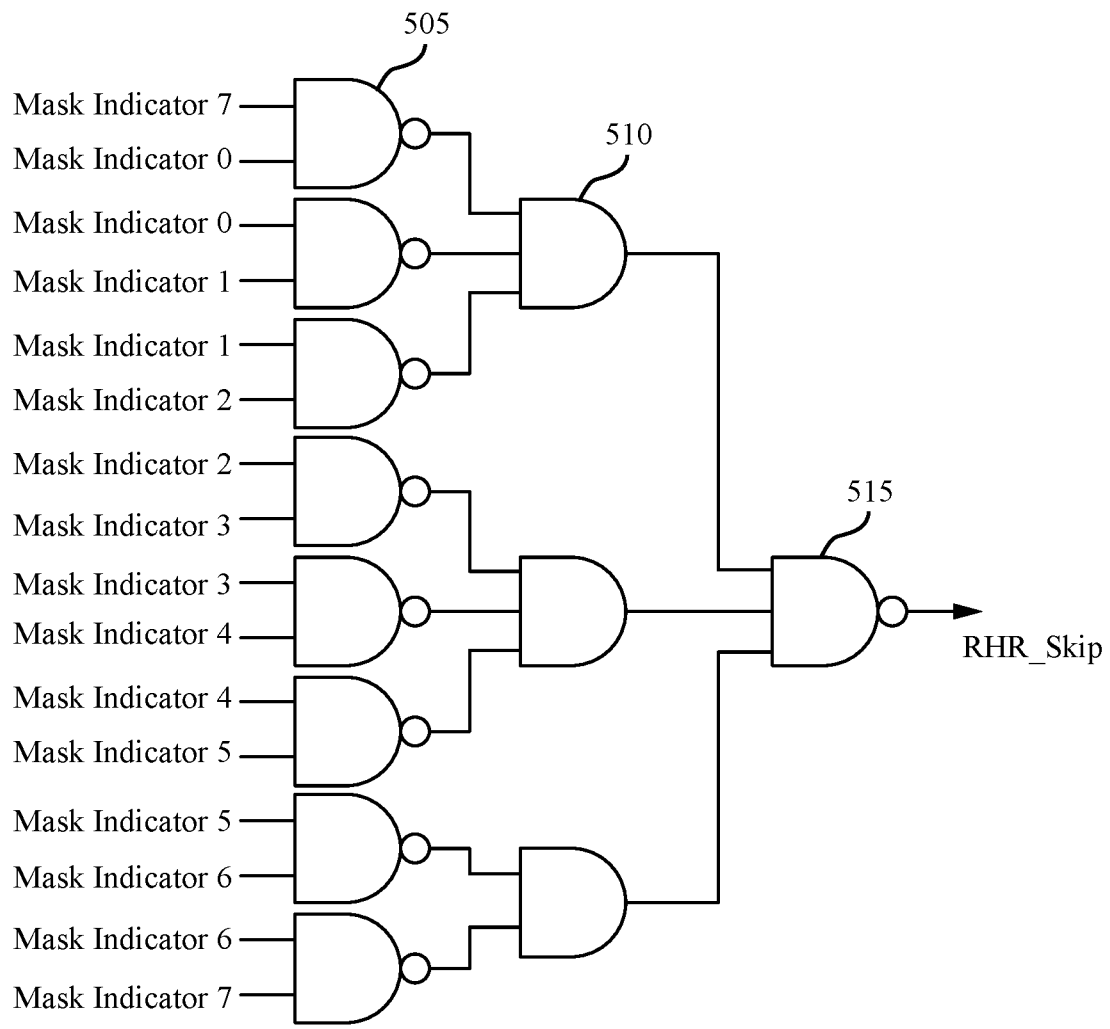
FIG. 5 illustrates an example of a logic diagram that supports techniques for reducing row hammer refresh in accordance with examples as disclosed herein.

FIG. 5 illustrates an example of a logic diagram 500 that supports techniques for reducing row hammer refresh in accordance with examples as disclosed herein. Logic diagram 500 may represent functionality performed by circuitry that may be included in a memory die, such as memory die 100 described with reference to FIG. 1. In some cases, logic diagram 500 may be implemented by a mask checking circuitry, such as mask checker 255.

Logic diagram 500 may represent an algorithm or circuitry for determining whether to perform a row hammer refresh on a victim row; e.g. a row that is immediately adjacent to (e.g., +/−1) a row that has been identified as an aggressor. Logic diagram 500 may be configured to determine whether at least one region that is adjacent to a region containing an aggressor row is unmasked, which may indicate that victim rows may need to be refreshed. Other logic diagrams may be implemented to determine whether +/−2 rows are masked using the principles described herein.

Logic diagram 500 may include multiple input NAND gates 505. A NAND gate (NOT-AND) is a logic gate that produces an output that is false (e.g., represented by a value of "0") only if all its inputs are true (e.g., represented by a value of "1").

Each input NAND gate 505 may take as its inputs a pair of mask indicators associated with a pair of adjacent regions. If a mask indicator is set to "1," for example, the corresponding region may be unmasked. If the mask indicator is set to "0," for example, the corresponding region may be masked. Each NAND gate 505 may output a "0" if both regions are unmasked (which may indicate that there is an aggressor row with an adjacent unmasked victim row), and may output a "1" otherwise. If any NAND gate 505 of logic diagram 500 outputs a "0," this may indicate that a victim row may need to be refreshed (because it is unmasked).

Logic diagram 500 may include multiple AND gates 510, each of which may be coupled to the outputs of multiple NAND gates 505. An AND gate is a logic gate which produces an output which is true only if all its inputs are true. If all of the NAND gates 505 output a "1," indicating that the corresponding victim rows may not need to be refreshed.

Logic diagram 500 may include an output NAND gate 515, which may be coupled to the outputs of multiple AND gates 510. The output NAND gate 515 may output a signal RHR_Skip that indicates whether a row hammer refresh operation can be skipped. The output NAND gate 515 may output an RHR_Skip signal of "0" if all of the outputs of AND gates 510 are "1," indicating that no victim rows need to be refreshed. The output NAND gate 515 may output an RHR_Skip signal of "1" if any of the outputs of AND gates 510 are "0," indicating that a victim row needs to be refreshed.

The logic diagram 500 may be configured to determine whether a victim row is unmasked and therefore may need to be refreshed, and may indicate the results of the determination via signal RHR_Skip. This signal may be used to control row hammer refresh operations, as described with reference to FIG. 6.

Figure 6:
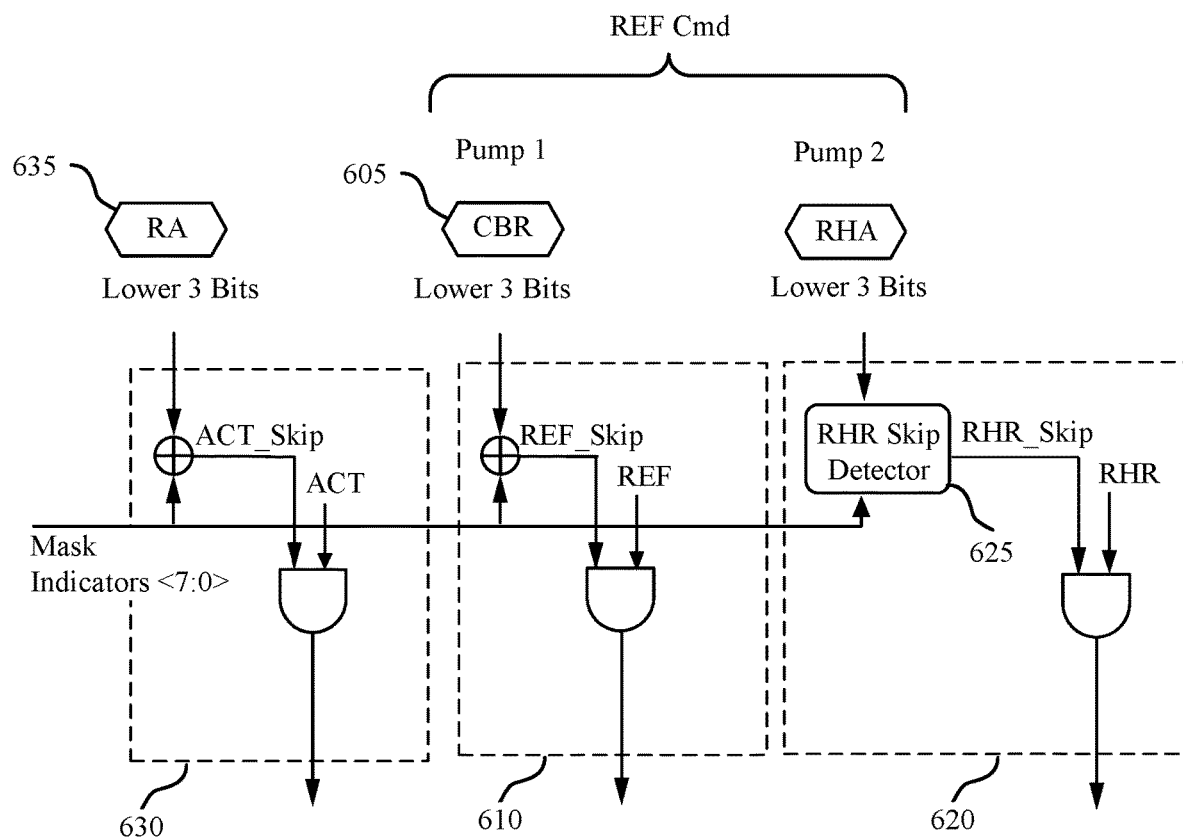
FIG. 6 illustrates an example of a system that supports techniques for reducing row hammer refresh in accordance with examples as disclosed herein.

FIG. 6 illustrates an example of a system 600 that supports techniques for reducing row hammer refresh in accordance with examples as disclosed herein. System 600 may depict portions of a memory die (such as memory die 100), such as in a refresh control circuit 165, that may use a double-pump approach for performing up to two refresh operations in response to a single refresh command, such as an AREF command. That is, system 600 may activate an internal refresh signal twice in response to the refresh command. System 600 may be an example of using the lower three bits of row addresses to define regions for masking, which may be used to determine whether particular rows may need to be refreshed. Other examples may use a different number of lower bits for defining and masking regions.

In some cases, during a first pump (e.g., a first activation of an internal refresh signal based on the refresh command), system 600 may generate a refresh signal REF to cause the row decoder 260 to perform a first refresh operation on a row of memory cells. The first refresh operation may be, for example, an auto-refresh operation, such as a Cas-before-Ras (CBR) operation, that refreshes a row based on a value stored in a counter 605, for example. That is, the value of the counter 605 may be used to identify a CBR row address. Counter 605 may keep track of the row to be refreshed by incrementing the value in counter 605 after each CBR refresh operation, for example.

In some cases, system 600 may determine whether to perform the first refresh operation based on whether the row specified by the CBR row address is masked. For example, in some cases, system 600 may include a CBR mask checker 610 that may be used to determine whether a region to which the row specified by the CBR row address belongs is masked, and to pass or mask the REF signal accordingly. CBR mask checker 610 may be included in mask checker 355, for example.

CBR mask checker 610 may receive eight one-bit mask indicators (Mask Indicators <7:0>) and may determine, based on the lower three bits of the CBR row address, whether the CBR row is masked, indicating that the refresh operation on the CBR row can be skipped. Based on that determination, CBR mask checker 610 may generate an internal signal, REF_Skip, that indicates whether the first refresh operation can be skipped. In system 600, REF_Skip may be set to "0" if the refresh can be skipped, and may be set to a "1" if the refresh operation cannot be skipped.

If REF_Skip is set to a "1," CBR mask checker 610 may output a refresh signal that indicates that the row should be refreshed, by, for example, passing the REF signal. Memory die 100 may then perform the first refresh operation on the row indicated by the CBR row address.

If REF_Skip is set to a "0," CBR mask checker 610 may output a refresh signal that indicates that the row should not be refreshed. Memory die 100 may then refrain from performing the first refresh operation on the row indicated by the CBR row address.

In some cases, the row indicated by the CBR row address may be identified as an aggressor row. In this case, a memory die may identify, based on the CBR row address, one or more adjacent rows (e.g., +/−1 and/or +/−2 adjacent word lines) that may be victim rows, and may perform a second refresh operation, such as a row hammer refresh operation, on an identified victim row. In some cases, system 600 may generate a row hammer refresh signal RHR to cause row decoder 260 to perform the second refresh operation during a second pump (e.g., a second activation of an internal refresh signal based on the refresh command).

In some cases, system 600 may identify a row hammer address (RHA), which may be a row address of a victim row, based on the CBR row address. For example, an RHA may be numerically consecutive with a CBR row address (for +/−1 adjacent victim rows) or may be equal to a CBR row address +/−2 (for +/−2 adjacent victim rows).

In some cases, system 600 may determine whether to perform the second refresh operation based on whether the row(s) specified by the RHA is masked. For example, in some cases, system 600 may include an RHR mask checker 620 that may be used to determine whether a region to which the row specified by the RHA belongs is masked, and to pass or mask the RHR signal accordingly. RHR mask checker 620 may be included in mask checker 255, for example. RHR mask checker 620 may include RHR skip detector 625, which may be configured to detect masking patterns, such as masking patterns 405, in which certain victim rows may not need to be refreshed. RHR skip detector 625 may include logic such as shown in logic diagram 500, for example.

RHR skip detector 625 may receive Mask Indicators <7:0> and may determine, based on the lower three bits of the RHA, whether the RHA row is masked, indicating that the row hammer refresh operation on the RHA row can be skipped (suppressed). Based on that determination, RHR skip detector 625 may generate an internal signal, RHR_Skip, that indicates whether the row hammer refresh operation can be skipped. In system 600, RHR_Skip may be set to "0" if the refresh operation can be skipped, and may be set to a "1" if the refresh operation cannot be skipped.

If RHR_Skip is set to a "1," RHR mask checker 620 may output a refresh signal that indicates that the row should be refreshed, by, for example, passing the RHR signal. Memory die 100 may then perform a row hammer refresh operation on the row indicated by the RHA.

If RHR_Skip is set to a "0," RHR mask checker 620 may output a signal indicating that the row should not be refreshed. Memory die 100 may then refrain from performing the row hammer refresh operation on the row indicated by the RHA, thereby reducing row hammer refreshes.

In some cases, a memory die may perform one, both, or neither of the refresh operations (e.g., auto refresh and row hammer refresh) based on the region masking. In some cases, a memory die may perform a first refresh operation during the first pump even if the second refresh operation of the second pump is suppressed, or vice versa. For example, a memory die may perform an auto-refresh operation and may suppress the row hammer refresh operation, or may suppress the auto-refresh operation and perform the row hammer refresh operation. In some cases, both refresh operations may be row hammer refresh operations (e.g., rather than an auto-refresh operation and a row hammer refresh operation).

In some cases, a memory die may use region masking to determine whether to perform an activate (ACT) operation on a word line in addition to or instead of using region masking to determine whether to perform a refresh operation. For example, if a memory die 100 receives a read command that specifies a read operation for a memory cell in a row that is included in a masked region (e.g., a row that does not contain data), such a read command may be erroneous or malevolent (e.g., the result of a row hammer attack). A memory die may not perform the activate operation if the row is included in a masked region, thereby potentially deterring a row hammer attack or other type of improper memory access.

In some cases, a memory die may perform the activate operation on a word line before (or as part of) performing a memory access operation, such as a read or write operation (which need not be followed by the refresh operations depicted in FIG. 6). The activate operation may activate the word line (e.g., by applying a voltage to the word line) to select a memory cell for the access operation. In some cases, the word line to be activated may be specified by a row address (RA) 625.

In some cases, system 600 may determine whether to perform the activate operation based on whether the row specified by the row address 635 is masked. For example, in some cases, system 600 may include an ACT mask checker 630 that may be used to determine whether a region to which the row specified by the row address 635 belongs is masked, and to pass or mask the ACT signal accordingly. ACT mask checker 630 may be included in mask checker 255, for example.

ACT mask checker 630 may receive Mask Indicators <7:0> and may determine, based on the lower three bits of the row address 635, whether the row address row is masked, indicating that the activate operation can be skipped. Based on that determination, ACT mask checker 630 may generate an internal signal, ACT_Skip, that indicates whether activate operation can be skipped. In system 600, ACT_Skip may be set to "0" if the activate operation can be skipped, and may be set to a "1" if the activate operation cannot be skipped.

If ACT_Skip is set to a "1," ACT mask checker 630 may output an activation signal that indicates that the row should be activated, by, for example, passing the ACT signal. Memory die 100 may then activate the word line of the row indicated by the row address.

If ACT_Skip is set to a "0," ACT mask checker 630 may output an activation signal that indicates that the row should not be activated. Memory die 100 may then refrain from activating the word line of the row indicated by the row address.

Figure 7:
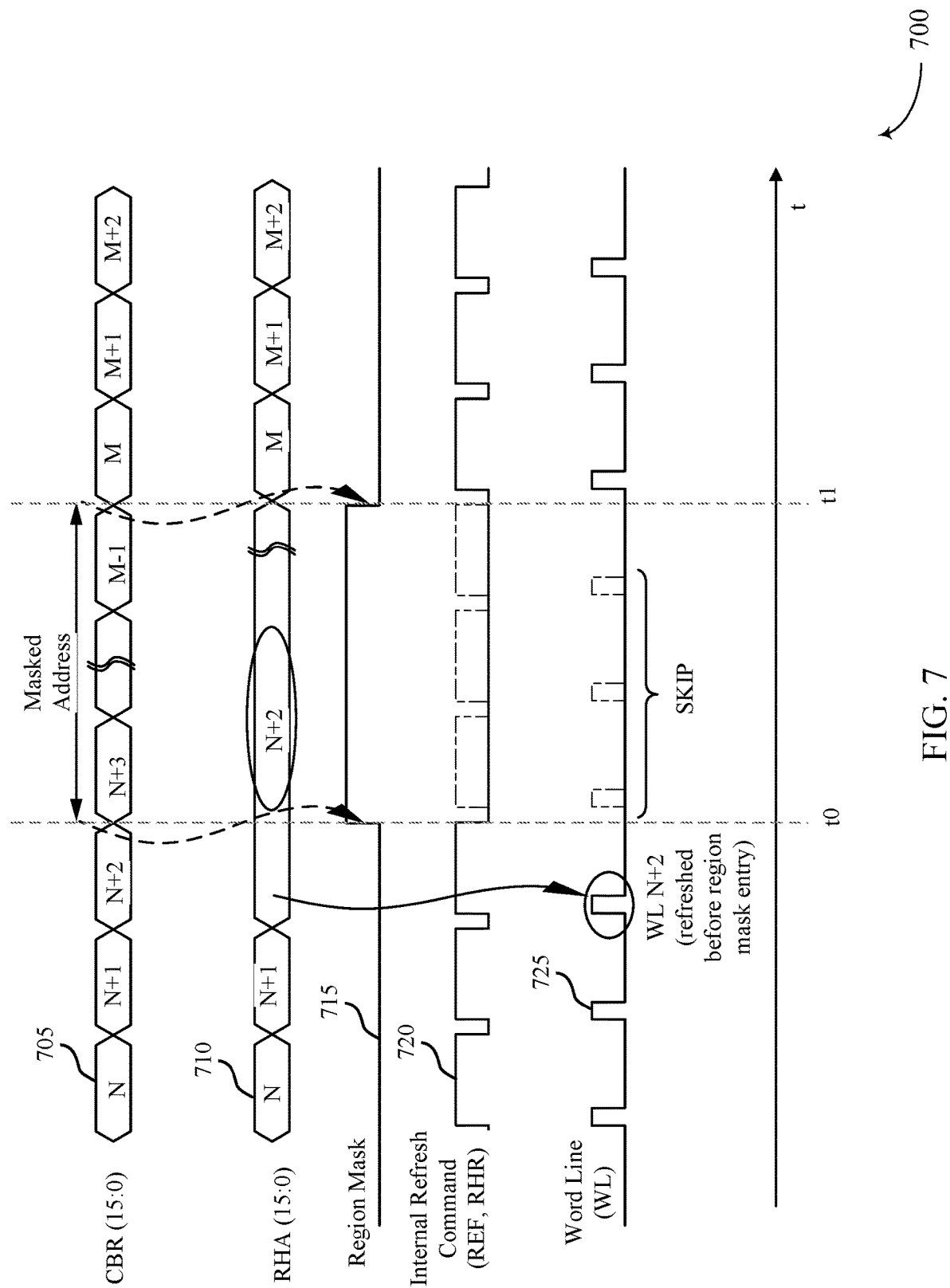
FIG. 7 illustrates an example of a timing diagram that supports techniques for reducing row hammer refresh in accordance with examples as disclosed herein.

FIG. 7 illustrates an example of a timing diagram 700 that supports techniques for reducing row hammer refresh in accordance with examples as disclosed herein. Timing diagram 700 depicts various addresses and signals that may be used by a memory die, such as memory die 100, during a double-pump refresh sequence such as described with reference to FIG. 6. Timing diagram 700 includes CBR row addresses 705 that may be used for a normal refresh operation such as an auto-refresh operation; RHA row addresses 710 that may be used for a row hammer refresh operation; a region mask signal 715 that may be activated to indicate whether a region is masked (e.g., corresponding to a mask indicator value for the region); an internal refresh signal 720 that may correspond to an REF signal or an RHR signal; and a word line signal 725 that may be activated to access a row of memory cells.

A memory die may perform, as an example, an any-to-any row redundancy refresh scheme in which the memory die activates all word lines for refreshing regardless of whether the word line is a redundant word line or not. In some cases, a redundant word line may be a word line that is coupled with memory cells whose data is replicated in memory cells coupled with a different word line. In some cases, the memory cells coupled with a redundant word line may not need to be refreshed, and refreshing such word lines may waste power.

In some cases, to skip activation of defective or redundant word lines during a refresh operation, a memory die may check redundancy information associated with each word line before refreshing the memory cells associated with the word line. In some cases, such checking may cause a one-cycle delay of the refresh operation to allow time for checking the redundancy information. That is, the refresh address may be delayed by one cycle relative to the CBR address. In such cases, the one-cycle delayed refresh operation was introduced to enable redundancy to be checked in the background with the result transferred at the next refresh operation. The delayed refresh operation may conflict with the use of region masking, however.

A memory die may also determine whether a word line is masked before performing a refresh operation on memory cells coupled with the word line, such as by checking a mask indicator for the region that includes the CBR address and the refresh address, as described herein. In such cases, the mask indicator signal may also be delayed by one cycle to accommodate the delayed refresh address and avoid missing a refresh of an unmasked row. Such a delay may reduce some of the power reduction benefits of using region masking because certain rows may be refreshed even if they are masked.

In some cases, a memory die 100 may perform an on-time refresh operation in which the mask indicator signal is not delayed, to maintain the power reduction benefits of using region masking as described herein. In such cases, the refresh address may not be delayed relative to the CBR address, and the memory die may skip activation of internal refresh commands and word lines when the region mask signal is activated (indicating that the region is masked), which may avoid incrementing the refresh address.

For example, as shown in timing diagram 700, at time t1 a word line signal associated with a word line having a row address of N+2 (meaning two consecutive row addresses after the first row address, N) may be activated. The region mask signal may be activated at time t2, indicating that the word line having row address N+3 may be masked.

Figure 8:
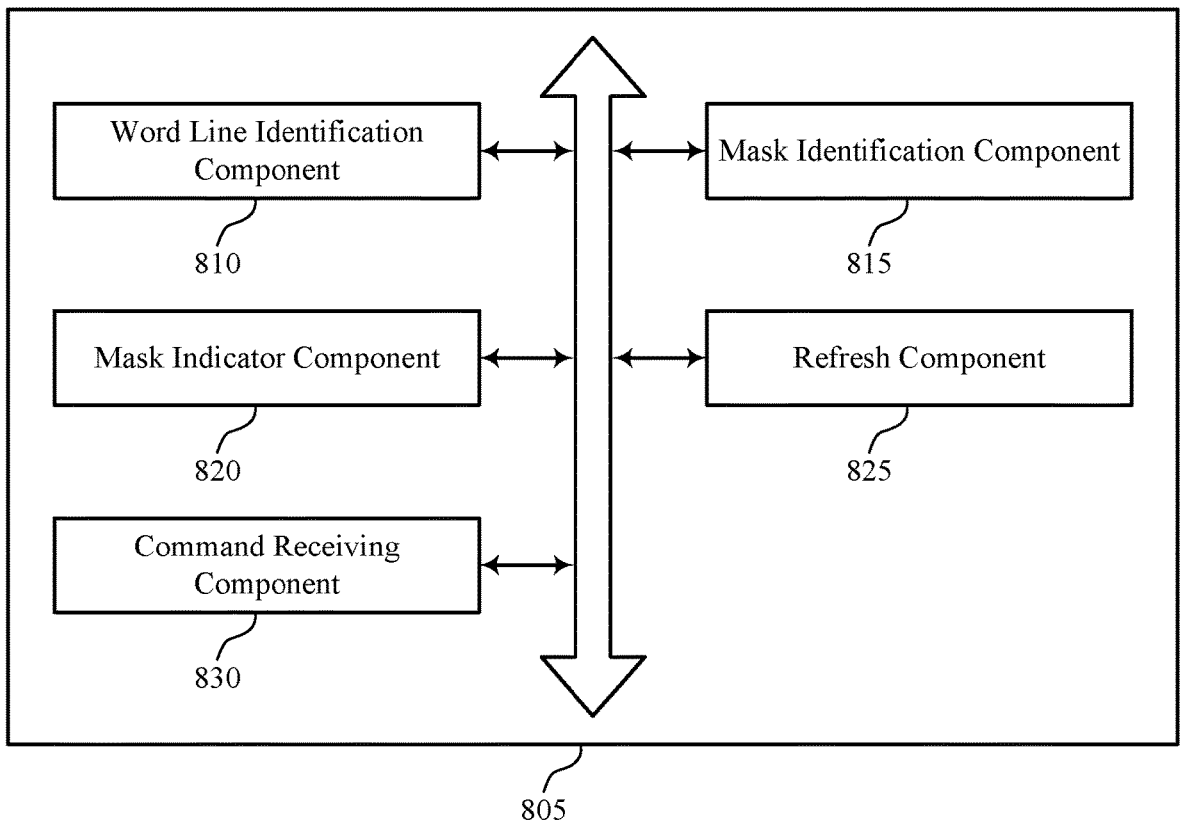
FIG. 8 shows a block diagram of a memory device that supports techniques for reducing row hammer refresh in accordance with examples as disclosed herein.

FIG. 8 shows a block diagram 800 of a memory die 805 that supports techniques for reducing row hammer refresh in accordance with examples as disclosed herein. The memory die 805 may be an example of aspects of a memory die as described with reference to FIG. 1. The memory die 805 may include a word line identification component 810, a mask identification component 815, a mask indicator component 820, a refresh component 825, and a command receiving component 830. Each of these modules may communicate, directly or indirectly, with one another (e.g., via one or more buses).

The word line identification component 810 may identify a first word line indicated by a command for a first refresh operation. In some examples, the word line identification component 810 may identify the first word line for which to perform a row hammer refresh operation based on a set of access operations performed on memory cells coupled with a second word line adjacent to the first word line. In some examples, the word line identification component 810 may identify a first address associated with the first word line based on a counter value, where identifying the first word line is based on the first address. In some examples, the word line identification component 810 may identify the counter value based on receiving the command.

In some examples, the word line identification component 810 may identify a second word line based on receiving the command, where identifying the first word line is based on identifying the second word line. In some cases, the second address is consecutive with the first address. In some examples, the word line identification component 810 may identify a third word line adjacent to the second word line based on identifying the first word line, where the second word line is between the first word line and the third word line.

In some examples, the word line identification component 810 may identify a row address associated with the first word line, where determining the mask indicator is based on identifying the row address. In some cases, the first word line and the second word line are included in a set of word lines associated with an array of memory cells that is segmented into a set of regions, each region associated with a set of non-adjacent word lines of the set of word lines and with a respective mask indicator.

The mask identification component 815 may identify a masking region associated with a second word line adjacent to the first word line based on identifying the first word line.

The mask indicator component 820 may determine, based on identifying the masking region, a mask indicator associated with the masking region, where the mask indicator indicates whether data is stored in the masking region. In some examples, the mask indicator component 820 may determine, based on identifying the first word line, a mask indicator of a masking region associated with the first word line, where the mask indicator indicates whether data is stored in the masking region.

In some examples, the mask indicator component 820 may identify a second address associated with the second word line based on the first address, where determining the mask indicator is based on identifying the second address. In some examples, the mask indicator component 820 may identify the mask indicator based on a set of least significant bits of the second address.

In some examples, the mask indicator component 820 may identify, based at least in part on a set of least significant bits of an address of the first word line, a second mask indicator of a second masking region associated with the first word line, where the second mask indicator indicates whether data is stored in the second masking region.

In some examples, the mask indicator component 820 may determine, based on a set of access operations performed on memory cells coupled with the first word line, that the second word line receives interference based on the set of access operations being performed on memory cells coupled with the first word line, where the determining the mask indicator is based on determining that the second word line is the victim word line.

In some examples, the mask indicator component 820 may determine, based on identifying the third word line, a third mask indicator of a third masking region associated with the third word line, where the third mask indicator indicates whether data is stored in the third masking region. In some examples, the mask indicator component 820 may identify a set of least significant bits of the row address, where determining the mask indicator is based on identifying the set of least significant bits of the row address.

The refresh component 825 may perform a second refresh operation on memory cells coupled with the second word line based on determining the mask indicator. In some examples, the refresh component 825 may refrain from performing the first refresh operation on memory cells coupled with the first word line based on the second mask indicator.

In some examples, the refresh component 825 may perform the first refresh operation on memory cells coupled with the first word line, where identifying the masking region associated with the second word line is based on preforming the first refresh operation. In some examples, the refresh component 825 may perform a third refresh operation on memory cells coupled with the third word line based on the third mask indicator. In some cases, the second refresh operation and the third refresh operation include row hammer refresh operations. In some examples, the refresh component 825 may perform the row hammer refresh operation on memory cells coupled with the first word line based on the mask indicator.

The command receiving component 830 may receive, from a host device, a command that indicates a refresh operation is to be performed. In some examples, the command receiving component 830 may receive a command that indicates a refresh operation is to be performed. In some cases, the second refresh operation is performed based on receiving the command.

Figure 9:
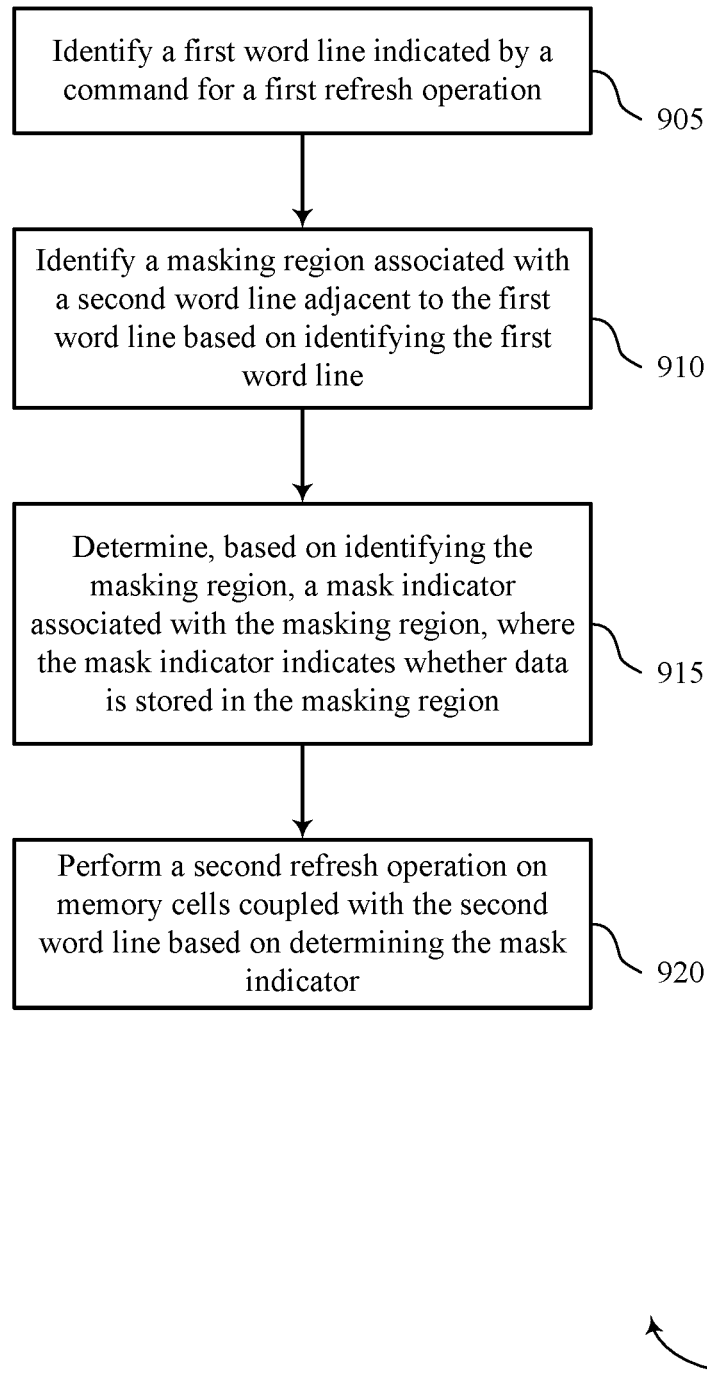
FIGS. 9 and 10 show flowcharts illustrating a method or methods that support techniques for reducing row hammer refresh in accordance with examples as disclosed herein.

FIG. 9 shows a flowchart illustrating a method or methods 900 that supports techniques for reducing row hammer refresh in accordance with aspects of the present disclosure. The operations of method 900 may be implemented by a memory die or its components as described herein. For example, the operations of method 900 may be performed by a memory die as described with reference to FIGS. 1 through 8. In some examples, a memory die may execute a set of instructions to control the functional elements of the memory die to perform the described functions. Additionally or alternatively, a memory die may perform aspects of the described functions using special-purpose hardware.

At 905, the memory die may identify a first word line indicated by a command for a first refresh operation. The operations of 905 may be performed according to the methods described herein. In some examples, aspects of the operations of 905 may be performed by a word line identification component as described with reference to FIG. 8.

At 910, the memory die may identify a masking region associated with a second word line adjacent to the first word line based on identifying the first word line. The operations of 910 may be performed according to the methods described herein. In some examples, aspects of the operations of 910 may be performed by a mask identification component as described with reference to FIG. 8.

At 915, the memory die may determine, based on identifying the masking region, a mask indicator associated with the masking region, where the mask indicator indicates whether data is stored in the masking region. The operations of 915 may be performed according to the methods described herein. In some examples, aspects of the operations of 915 may be performed by a mask indicator component as described with reference to FIG. 9.

At 920, the memory die may perform a second refresh operation on memory cells coupled with the second word line based on determining the mask indicator. The operations of 920 may be performed according to the methods described herein. In some examples, aspects of the operations of 920 may be performed by a refresh component as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for identifying a first word line indicated by a command for a first refresh operation, identifying a masking region associated with a second word line adjacent to the first word line based on identifying the first word line, determining, based on identifying the masking region, a mask indicator associated with the masking region, where the mask indicator indicates whether data is stored in the masking region, and performing a second refresh operation on memory cells coupled with the second word line based on determining the mask indicator.

Some examples of the method 900 and the apparatus described herein may further include operations, features, means, or instructions for identifying a first address associated with the first word line based on a counter value, where identifying the first word line may be based on the first address, and identifying a second address associated with the second word line based on the first address, where determining the mask indicator may be based on identifying the second address.

In some examples of the method 900 and the apparatus described herein, identifying the mask indicator associated with the second word line may include operations, features, means, or instructions for identifying the mask indicator based on a set of least significant bits of the second address.

Some examples of the method 900 and the apparatus described herein may further include operations, features, means, or instructions for receiving, from a host device, a command that indicates a refresh operation may be to be performed, and identifying the counter value based on receiving the command.

In some examples of the method 900 and the apparatus described herein, the second refresh operation may be performed based on receiving the command. In some examples of the method 900 and the apparatus described herein, the second address may be consecutive with the first address.

Some examples of the method 900 and the apparatus described herein may further include operations, features, means, or instructions for identifying, based at least in part a set of least significant bits of an address of the first word line, a second mask indicator of a second masking region associated with the first word line, where the second mask indicator indicates whether data may be stored in the second masking region, and refraining from performing the first refresh operation on memory cells coupled with the first word line based on the second mask indicator.

Some examples of the method 900 and the apparatus described herein may further include operations, features, means, or instructions for performing the first refresh operation on memory cells coupled with the first word line, where identifying the masking region associated with the second word line may be based on preforming the first refresh operation.

In some examples of the method 900 and the apparatus described herein, the first word line and the second word line may be included in a set of word lines associated with an array of memory cells that may be segmented into a set of regions, each region associated with a set of non-adjacent word lines of the set of word lines and with a respective mask indicator.

Some examples of the method 900 and the apparatus described herein may further include operations, features, means, or instructions for determining, based on a set of access operations performed on memory cells coupled with the first word line, that the second word line receives interference based on the set of access operations being performed on memory cells coupled with the first word line, where the determining the mask indicator may be based on determining that the second word line may be the victim word line.

Some examples of the method 900 and the apparatus described herein may further include operations, features, means, or instructions for identifying a third word line adjacent to the second word line based on identifying the first word line, where the second word line may be between the first word line and the third word line, determining, based on identifying the third word line, a third mask indicator of a third masking region associated with the third word line, where the third mask indicator indicates whether data may be stored in the third masking region, and performing a third refresh operation on memory cells coupled with the third word line based on the third mask indicator.

In some examples of the method 900 and the apparatus described herein, the second refresh operation and the third refresh operation include row hammer refresh operations.

Figure 10:
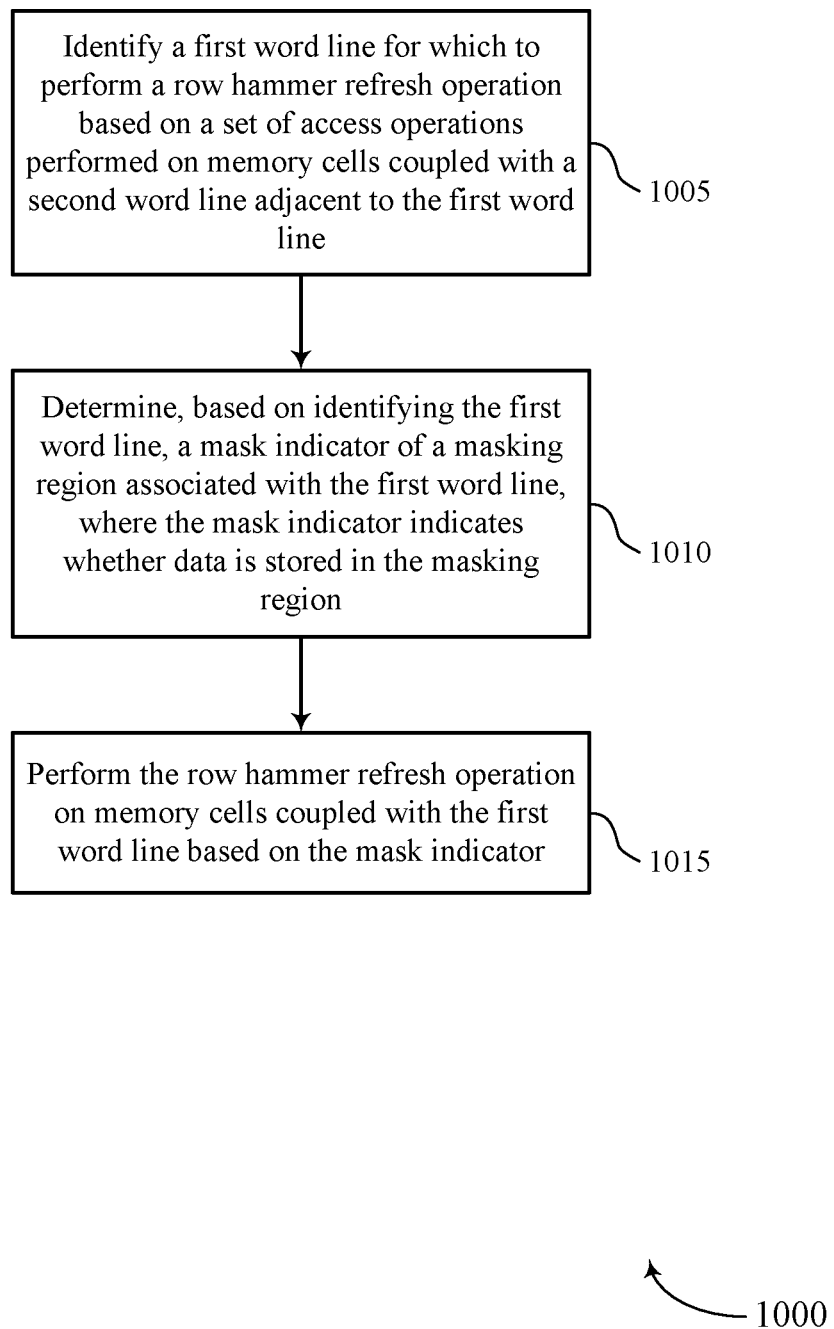

FIG. 10 shows a flowchart illustrating a method or methods 1000 that supports techniques for reducing row hammer refresh in accordance with aspects of the present disclosure. The operations of method 1000 may be implemented by a memory die or its components as described herein. For example, the operations of method 1000 may be performed by a memory die as described with reference to FIGS. 1 through 8. In some examples, a memory die may execute a set of instructions to control the functional elements of the memory die to perform the described functions. Additionally or alternatively, a memory die may perform aspects of the described functions using special-purpose hardware.

At 1005, the memory die may identify a first word line for which to perform a row hammer refresh operation based on a set of access operations performed on memory cells coupled with a second word line adjacent to the first word line. The operations of 1005 may be performed according to the methods described herein. In some examples, aspects of the operations of 1005 may be performed by a word line identification component as described with reference to FIG. 8.

At 1010, the memory die may determine, based on identifying the first word line, a mask indicator of a masking region associated with the first word line, where the mask indicator indicates whether data is stored in the masking region. The operations of 1010 may be performed according to the methods described herein. In some examples, aspects of the operations of 1010 may be performed by a mask indicator component as described with reference to FIG. 8.

At 1015, the memory die may perform the row hammer refresh operation on memory cells coupled with the first word line based on the mask indicator. The operations of 1015 may be performed according to the methods described herein. In some examples, aspects of the operations of 1015 may be performed by a refresh component as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for identifying a first word line for which to perform a row hammer refresh operation based on a set of access operations performed on memory cells coupled with a second word line adjacent to the first word line, determining, based on identifying the first word line, a mask indicator of a masking region associated with the first word line, where the mask indicator indicates whether data is stored in the masking region, and performing the row hammer refresh operation on memory cells coupled with the first word line based on the mask indicator.

Some examples of the method 1000 and the apparatus described herein may further include operations, features, means, or instructions for identifying a row address associated with the first word line, where determining the mask indicator may be based on identifying the row address.

Some examples of the method 1000 and the apparatus described herein may further include operations, features, means, or instructions for identifying a set of least significant bits of the row address, where determining the mask indicator may be based on identifying the set of least significant bits of the row address.

Some examples of the method 1000 and the apparatus described herein may further include operations, features, means, or instructions for receiving a command that indicates a refresh operation may be to be performed, and identifying the second word line based on receiving the command, where identifying the first word line may be based on identifying the second word line.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array segmented into a set of regions each including a set of interleaved word lines, a storage component configured to store a set of mask indicators each associated with a respective region of the set of regions, a refresh component configured to, identify, based on identifying the first region, a second region of the set of regions, the second region adjacent to the first region, determine, based on identifying the second region, a first mask indicator of the set of mask indicators, the first mask indicator associated with the second region, where the first mask indicator indicates whether data is stored in the second region, and perform, during the refresh cycle, a second refresh operation on memory cells coupled with one or more of the set of interleaved word lines of the second region based on the first mask indicator.

Some examples of the apparatus may include an address component configured to identify a first address associated with a first word line of the first region; identify, based on the first address, a second address associated with a second word line in the second region; and send the second address to the refresh component, where the refresh component is configured to determine the first mask indicator based at least in part on least significant bits of the second address.

Some examples may further include initiating the refresh cycle based on a refresh trigger, and provide an indication of the refresh trigger to the address component, where the address component may be configured to identify the first address based on the indication of the refresh trigger.

In some examples, the refresh component may include operations, features, means, or instructions for receive an indication of each mask indicator of the set of mask indicators, and generate a signal indicating whether to perform the second refresh operation based on the indications, where the refresh component may be configured to perform the second refresh operation based on the signal.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
    identifying a first word line indicated by a command for a first refresh operation;
    identifying a masking region associated with a second word line adjacent to the first word line based at least in part on identifying the first word line;
    determining, based at least in part on identifying the masking region, a mask indicator associated with the masking region, wherein the mask indicator indicates whether data is stored in the masking region; and
    performing a second refresh operation on memory cells coupled with the second word line based at least in part on determining the mask indicator.

2. The method of claim 1, further comprising:
    identifying a first address associated with the first word line based at least in part on a counter value, wherein identifying the first word line is based at least in part on the first address; and
    identifying a second address associated with the second word line based at least in part on the first address, wherein determining the mask indicator is based at least in part on identifying the second address.

3. The method of claim 2, wherein identifying the mask indicator associated with the second word line comprises:
    identifying the mask indicator based at least in part on a plurality of least significant bits of the second address.

4. The method of claim 2, further comprising: receiving, from a host device, the command that indicates the first refresh operation is to be performed; and identifying the counter value based at least in part on receiving the command.

5. The method of claim 4, wherein the second refresh operation is performed based at least in part on receiving the command.

6. The method of claim 2, wherein the second address is consecutive with the first address.

7. The method of claim 1, further comprising:
    identifying, based at least in part a plurality of least significant bits of an address of the first word line, a second mask indicator of a second masking region associated with the first word line, wherein the second mask indicator indicates whether data is stored in the second masking region; and
    refraining from performing the first refresh operation on memory cells coupled with the first word line based at least in part on the second mask indicator.

8. The method of claim 1, further comprising:
performing the first refresh operation on memory cells coupled with the first word line, wherein identifying the masking region associated with the second word line is based at least in part on performing the first refresh operation.

9. The method of claim 1, wherein the first word line and the second word line are included in a set of word lines associated with an array of memory cells that is segmented into a plurality of regions, each region associated with a plurality of non-adjacent word lines of the set of word lines and with a respective mask indicator.

10. The method of claim 1, further comprising:
determining, based at least in part on a plurality of access operations performed on memory cells coupled with the first word line, that the second word line receives interference based at least in part on the plurality of access operations being performed on memory cells coupled with the first word line, wherein the determining the mask indicator is based at least in part on determining that the second word line is a victim word line.

11. The method of claim 1, further comprising:
identifying a third word line adjacent to the second word line based at least in part on identifying the first word line, wherein the second word line is between the first word line and the third word line;
determining, based at least in part on identifying the third word line, a third mask indicator of a third masking region associated with the third word line, wherein the third mask indicator indicates whether data is stored in the third masking region; and
performing a third refresh operation on memory cells coupled with the third word line based at least in part on the third mask indicator.

12. The method of claim 11, wherein the second refresh operation and the third refresh operation comprise row hammer refresh operations.

* * * * *